United States Patent
Sellatmamby et al.

(10) Patent No.: US 8,362,587 B2
(45) Date of Patent: Jan. 29, 2013

(54) ULTRA HIGH SPEED SIGNAL TRANSMISSION/RECEPTION INTERCONNECT

(75) Inventors: Christopher V. Sellatmamby, Alberta (CA); Steven H. Slupsky, Alberta (CA); Brian Moore, Alberta (CA)

(73) Assignee: Scanimetrics Inc., Edmonton, Alberta (CA)

( * ) Notice: Subject to any disclaimer, the term of this patent is extended or adjusted under 35 U.S.C. 154(b) by 22 days.

(21) Appl. No.: 12/599,218

(22) PCT Filed: May 8, 2008

(86) PCT No.: PCT/CA2008/000861
§ 371 (c)(1),
(2), (4) Date: Nov. 23, 2010

(87) PCT Pub. No.: WO2008/134889
PCT Pub. Date: Nov. 13, 2008

(65) Prior Publication Data
US 2011/0057291 A1    Mar. 10, 2011

Related U.S. Application Data

(60) Provisional application No. 60/916,585, filed on May 8, 2007.

(51) Int. Cl.
| | |
|---|---|
| H01L 29/00 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ........ 257/531; 257/379; 257/516; 257/528; 257/904; 257/E21.022

(58) Field of Classification Search .................. 257/379, 257/516, 528, 531, 904, E21.022
See application file for complete search history.

(56) References Cited

U.S. PATENT DOCUMENTS

| | | | |
|---|---|---|---|
| 4,777,458 A | * | 10/1988 | Pardini .......................... 333/112 |
| 5,243,703 A | | 9/1993 | Farmwald et al. |
| 5,293,400 A | | 3/1994 | Monod et al. |
| 5,345,231 A | | 9/1994 | Koo et al. |
| 5,361,277 A | | 11/1994 | Grover |

(Continued)

FOREIGN PATENT DOCUMENTS

| | | |
|---|---|---|
| EP | 1 617 475 A1 | 1/2006 |
| JP | 11-68033 | 3/1999 |

(Continued)

OTHER PUBLICATIONS

D. Mizoguchi, Y. Yusof, N. Miura, T. Sakura, T. Kuroda, "A 1.2Gb/s/pin Wireless Superconnect Based on Inductive Inter-chip Signaling (IIS)", ISSCC 2004.

(Continued)

*Primary Examiner* — Ida M Soward
(74) *Attorney, Agent, or Firm* — Davis & Bujold, PLLC

(57) ABSTRACT

An interconnect for transmitting an electric signal between electronic devices includes a first coupling element electromagnetically coupled to, and immediately juxtaposed to, a second coupling element. The first coupling element is mounted on and is electrically connected to a first electronic device having a first integrated circuit. The second coupling element may be mounted on and electrically connected to the first electronic device, and electrically connected to an interconnect on a second electronic device, or the second coupling element may be mounted on and electrically connected to the second electronic device.

14 Claims, 21 Drawing Sheets

U.S. PATENT DOCUMENTS

| | | | |
|---|---|---|---|
| 5,557,138 A * | 9/1996 | Ikeda et al. | 257/531 |
| 5,764,655 A | 6/1998 | Kirihata et al. | |
| 5,952,849 A | 9/1999 | Haigh | |
| 5,954,804 A | 9/1999 | Farmwald et al. | |
| 6,003,777 A | 12/1999 | Kowalski | |
| 6,114,938 A * | 9/2000 | Iida et al. | 336/200 |
| 6,144,281 A * | 11/2000 | Lorris | 336/200 |
| 6,161,205 A | 12/2000 | Tuttle | |
| 6,175,727 B1 * | 1/2001 | Mostov | 455/307 |
| 6,249,205 B1 * | 6/2001 | Meadors et al. | 336/200 |
| 6,262,600 B1 | 7/2001 | Haigh et al. | |
| 6,331,782 B1 | 12/2001 | White et al. | |
| 6,412,086 B1 | 6/2002 | Friedman et al. | |
| 6,449,308 B1 | 9/2002 | Knight, Jr. et al. | |
| 6,476,704 B2 * | 11/2002 | Goff | 336/200 |
| 6,484,279 B2 | 11/2002 | Akram | |
| 6,525,566 B2 | 2/2003 | Haigh et al. | |
| 6,566,761 B1 | 5/2003 | Sharma et al. | |
| 6,573,801 B1 | 6/2003 | Benham et al. | |
| 6,625,682 B1 | 9/2003 | Simon et al. | |
| 6,747,469 B2 | 6/2004 | Rutten | |
| 6,759,863 B2 | 7/2004 | Moore | |
| 6,864,558 B2 * | 3/2005 | Momtaz et al. | 257/531 |
| 6,873,065 B2 | 3/2005 | Haigh et al. | |
| 6,882,239 B2 | 4/2005 | Miller | |
| 6,885,090 B2 | 4/2005 | Franzon et al. | |
| 6,885,202 B2 | 4/2005 | Slupsky | |
| 6,903,578 B2 | 6/2005 | Haigh et al. | |
| 6,927,490 B2 | 8/2005 | Franzon et al. | |
| 6,943,658 B2 * | 9/2005 | Gardner | 336/200 |
| 7,057,518 B2 | 6/2006 | Schmidt | |
| 7,064,442 B1 | 6/2006 | Lane et al. | |
| 7,073,111 B2 | 7/2006 | Whetsel | |
| 7,075,329 B2 | 7/2006 | Chen et al. | |
| 7,081,803 B2 * | 7/2006 | Takaya et al. | 336/200 |
| 7,085,118 B2 * | 8/2006 | Inoue et al. | 361/119 |
| 7,109,730 B2 | 9/2006 | Slupsky | |
| 7,130,944 B2 | 10/2006 | Perino et al. | |
| 7,154,349 B2 * | 12/2006 | Cabanillas | 331/117 R |
| 7,161,248 B2 * | 1/2007 | Karasawa et al. | 257/758 |
| 7,200,830 B2 | 4/2007 | Drost et al. | |
| 7,202,687 B2 | 4/2007 | Khandros et al. | |
| 7,263,343 B2 * | 8/2007 | Mitsunaka et al. | 455/292 |
| 7,271,465 B2 * | 9/2007 | Jessie et al. | 257/531 |
| 7,579,670 B2 * | 8/2009 | Shastri et al. | 257/531 |
| 7,669,312 B2 * | 3/2010 | Terrovitis | 29/605 |
| 8,058,960 B2 * | 11/2011 | Hebert et al. | 336/200 |
| 8,165,552 B2 * | 4/2012 | Rofougaran et al. | 455/274 |
| 8,227,892 B2 * | 7/2012 | Chang | 257/531 |
| 2002/0119764 A1 * | 8/2002 | Yamakawa et al. | 455/333 |
| 2002/0186106 A1 | 12/2002 | Miller | |
| 2003/0100200 A1 | 5/2003 | Franzon et al. | |
| 2004/0004216 A1 | 1/2004 | Eldridge et al. | |
| 2005/0086021 A1 | 4/2005 | Khandros et al. | |
| 2005/0271147 A1 | 12/2005 | Dupuis | |
| 2006/0022336 A1 | 2/2006 | Franzon et al. | |
| 2006/0170071 A1 * | 8/2006 | Imaoka et al. | 257/531 |
| 2006/0186893 A1 | 8/2006 | Schmidt | |
| 2006/0224796 A1 | 10/2006 | Vigouroux et al. | |
| 2006/0252375 A1 | 11/2006 | Wu et al. | |
| 2006/0273809 A1 | 12/2006 | Miller et al. | |
| 2007/0045773 A1 * | 3/2007 | Mi et al. | 257/531 |
| 2007/0245056 A1 | 10/2007 | Gustat | |
| 2007/0247268 A1 * | 10/2007 | Oya et al. | 336/200 |
| 2007/0262840 A1 * | 11/2007 | Matsutani et al. | 336/12 |
| 2008/0106469 A1 | 5/2008 | Kikkawa et al. | |
| 2008/0255182 A1 | 10/2008 | Qian et al. | |
| 2010/0109092 A1 * | 5/2010 | Arnborg | 257/379 |

FOREIGN PATENT DOCUMENTS

| | | |
|---|---|---|
| JP | 2005-217804 | 8/2005 |
| WO | WO 01/63827 | 8/2001 |
| WO | 2005/043482 A2 | 3/2005 |
| WO | WO 2005/076885 | 8/2005 |
| WO | 2006/110207 A2 | 10/2006 |
| WO | WO 2007/101345 | 9/2007 |

OTHER PUBLICATIONS

J. Kim, I. Verbauwhed, M. Chang, "A 5.6-mW 1•gb/s/pair Pulsed Signalling Transceiver for a Fully AC Coupled Bus", IEEE Journal of Solid-State Circuits, vol. 40, No. 6, Jun. 2005.

L. Luo, Wilson, S. Mick, J. Xu, L. Zhang, P. Franzon, "3Gb/s AC-Coupled Chip-to-Chip Communication using a Low-Swing Pulse Receiver", ISSCC 2005, paper 28.7.

J. Ko, J. Kim, Z. Xu, Q Gu, C, Chien M. Chang, "An RF/Baseband FDMA-Interconnect Transceiver for Reconfigurable Multiple Access Chip-to-Chip Communication", ISSCC.

B. Floyd et al, "Wireless Interconnection in CMOS IC with Integrated Antennas" IEEE ISSCC 2000, Paper WA 19.6, Feb. 2000, pp. 238-239.

IEEE Computer Society, "IEEE Standard Test Access Port and Boundary-Scan Architecture" IEEE Std. 1149.1-2001, New York: IEEE, 2001.

S. Sunter and B. Nadeau-Dostic, "Complete, Contactless I/O Testing—Reaching the Boundary in Minimizing Digital IC Testing Cost" International Test Conference 2002, Paper 16.2.

N. Park et al, "Quality-effective repair of multichip module systems" Journal of Systems Architecture, 47. Apr. 2002, pp. 883-900.

C. Seilathamby et al, "Wireless Wafer Probe" Southwest Test Workshop, Session 7, Jun. 9, 2004.

W. Mann, "Leading Edge of Wafer Level Testing" Proceedings of the ITC International Test Conference 2004.

B. Moore, C. Backhouse & M. Margala, "Design of a Wireless On-Wafer Sub-Micron Characterization System" IEEE TVLSI Journal vol. 2, Feb. 2005.

"International Technology Roadmap for Semiconductors" SIA 2005 Edition.

C. Sellathamby et al, "Non-Contact Wafer Probe using Wireless Probe Cards" International Test Conference, IEEE, 2005, Paper 18.3.

P. Collins, I. Reis, M. Simonen and M. Houcke, "A Transparent Solution for Providing Remote Wired or Wireless Communication to Board and System Level Boundary—Scan Architectures" International Test Conference 2005, Paper 2.2.

F. de Jong and A. Biewenga, "SiP-TAP: JTAG for SiP" International Test Conference 2006, Paper 14.3.

L Whetsel. "A High Speed Reduced Pin Count JTAG Interface" International Test Conference 2006 Paper 10.1.

K. Harvey, "Cost of Test Issues for RF SiP Circuits" KGD Conference, 2006.

J. McElney, "Testing of Converging Device Technologies: High-Efficiency Multi-Site Test for SiP Mobile Technologies" KGD Conference, 2006.

T. Kuroda, "Inductive-Coupling Inter-Chip Link for System in a Package" CMOS—Emerging Technologies Workshop Banff, AB, Canada, Jul. 19, 2006.

I. Reis, P. Collins and M. Houcke, "On-line Boundary-Scan Testing in Service of Extended Products" (Abstract) International Test Conference 2006 Lecture 4.2.

P. Cauvet, "SiP Technology and Testing" Mar. 28, 2007.

F. Henley, Y. M Liu, K. Otsuka, "A highspeed flat panel in-process test system for TFT array using electro-optic effects," IEICE Trans. Electron, E76-C, 64-67 (Jan. 1993).

Francois J Henley, "An ultra high speed test system" IEEE Design & Test of Computers, (Feb. 1989), pp. 18-24.

Harame et al. "Design automation methodology and rf/analog modeling for rf CMOS an SiGe BiCMOS technologies." IBM Journal of Research and Development, vol. 47, No. 2/3 dated Mar./May 2003, pp. 139-175.

H. Ishikuro, N. Miura, and T. Kuroda, "Wideband Inductive-Coupling Interface for High-Performance Portable System", IEEE 2007 Custom Integrated Circuits Conference (CICC).

Japanese Office Action dated Sep. 4, 2012. Including English Translation.

* cited by examiner

_US 8,362,587 B2_

ULTRA HIGH SPEED SIGNAL TRANSMISSION/RECEPTION INTERCONNECT

FIELD

The present patent document relates to a communication link for transmitting an electric signal between electronic devices

BACKGROUND

Communication within or between integrated circuits is a fundamental attribute of electronic devices. Such communication can involve communication between similar or different chips on a laminate printed circuit board or similar substrate material or within the chip itself. The chips themselves may be manufactured using similar or different technologies. Recent trends show demand for high-speed communication technology is increasing and is critical to address the demand of higher bandwidth and to accommodate testing of high-speed devices at the device and circuit levels. In addition to this, as devices are increasing in complexity there is increasing need to lower the power consumption, decrease the size and reduce the overall system cost. This has created a significant momentum in the area for high-speed interfacing and interconnect.

In recent years interconnect technology has evolved from parallel digital to serial based communication to enable transfer of data in the gigabit range using direct wiring or external transform coupling. Conventional serial I/O cells require ESD (Electro Static Discharge) protection circuits resulting in less power-efficiency, speed limitations, and larger pad size. Furthermore, within a modest power budget, signals can only be consistently and reliably transmitted over a short data path, making them prone to interference and of limited operating range for high-speed/frequency. It is possible to overcome the signal limits but at the expense of increased power. For example it is possible to go 10 Gbits/second using the 10 G Ethernet serial wired link. However, such transceivers require up to 15 Watts of power which is not a practical communications method except for point to point communication for a small number of channels. Power consumption is a major limiting factor where multiple channels of I/O are required thus each individual I/O channel must meet a prescribed power budget many times lower than that of the proposed 10 G standard. Large amounts of power are required as a consequence of techniques used to address signal degradation which increases with the length of the data path. Data path length and its impact on signal integrity is often a major concern with prior art solutions. Examples of high-speed signal communication include transfer and/or sharing of data at chip-to-chip, chip-to-substrate, and board-to-board or backplane level and their converse.

The most commonly used methods of signal communication between electronic devices include making physical, electrical contact between two nodes. Electrical signals may comprise DC or AC signals or both. Alternative methods to interconnect nodes include methods of AC coupling including capacitive and inductive techniques where the DC component is not available or where the DC component would add noise or have some other unwanted effect. Further, signals may be coupled using optical methods, magnetic methods, or radio frequency transmission/reception. While digital communications between integrated circuits are of primary interest, communication involving both digital and analog signals is also needed.

Referring to FIG. 1a, a conventional apparatus of an integrated circuit (IC or chip) 10 is shown for input of a signal 14 sent from a first internal electronic application specific circuit 16 on the chip 10 to one or more pads 112. First application specific circuit 16 may be an output device or an input device such as a receiver for receiving signal 14 from an external source. Signal 14 may be digital or analog. Signal 14 is conditioned as it is propagated toward pad 112 via a buffer 18. Electrostatic discharge protection (ESD) is provided by diodes 20 which divert ESD currents to ground or power supply or other protective circuits. The protective circuits are intended to absorb and dissipate destructive energy originating from an external source coming in electrical contact with pad 112 before reaching sensitive internal application specific circuits 16.

Such apparatus 10 has limitations. Compensation is required when buffers 18 and pad 112 have different characteristics. Electrostatic discharge diodes 20 and associated protective circuits exhibit a large amount of parasitic capacitance and thus apparatus 10 introduces a large amount of capacitance into the signal path. The signal energy is absorbed by the parasitic capacitance and dissipated as heat as signal 14 is propagated toward pad 112. Generally, the amount of signal loss increases with frequency. Further, signal 14 is delayed in time as it is propagated by the chain of buffers 18. The compensation and protection thus provided lowers the energy of wanted signals 14 coming from or going between the internal circuits and the external pad and, by extension, lowers available signal levels at a far transmitter or receiver.

Prior art I/O cells involve use of protective diodes and passive and active elements to absorb and attenuate destructive voltages and currents. These typically involve active structures, which load the I/O cell. For example, it is known that a typical protection diode structure has an equivalent capacitance of approximately 1 pF. The effect of a 1 pF capacitance in the signal path of a 2 GHz signal would be an effective load of 88 ohms per wire In a differential signalling schema this would present an equivalent load of 44 ohm compared to a typical transmission impedance of 50 ohms. In other words there is more energy used (in this case) overcoming the load of the protection system than is used to send the active signals, and so the signal path requires additional amplification to compensate for the signal loss. Consequently, in our example, the system requires twice the area and consumes twice the power. While this case is a simplification, it is illustrative of the problems that the current practices involve. In fact, if an I/O system is to achieve higher data rates the problem is even worse: at twice the frequency approximately 80% of the driver's energy is consumed to overcome the load of the protection circuitry.

Referring to FIG. 1b, for conventional apparatus 10, an essentially similar apparatus may be used for input of a signal through pad 112 to one or more internal circuits 24 or to an output device for transmission of signal 14 to an external receiver.

FIG. 16a of United States Publication No. 2005/0271147 (Dupuis) entitled "Transformer isolation for digital power supply" teaches a transformer apparatus to provide isolation between two integrated circuits located in close proximity within a single component package (Dupuis FIGS. 6, 15, 15a, 16, and 16a). While Dupuis describes this as a high-speed data link, Dupuis actually uses a RF carrier that is 20 times the actual data (information) rate.

Similarly, Lane et al. in U.S. Pat. No. 7,064,442 teaches an apparatus to provide isolation between two integrated circuits located in close proximity within a single component package using a transformer, the transformer being located on a separate circuit within the same package. In this case, the external I/O signals interface directly with active electronic elements. Only for internal signals, after active electronics processing, within the package is the transformer/dielectric isolation formed and utilized.

In a similar manner as Lane et al, U.S. Pat. No. 5,952,849 (Haigh) entitled "Logic isolator with high transient immunity", discloses an apparatus to provide isolation between two circuits using a transformer, where the transformer 38 is formed by windings 36 and 42 on separate and discrete ferrite cores coupled by winding 42.

In a similar manner as Dupuis, U.S. Pat. No. 7,075,329 (Chen et al.) entitled "Signal isolators using micro-transformers" discloses an apparatus that provides isolation between two circuits using a transformer, where the transformer is a separate and discrete component. In Chen the external I/O pads or signals labelled 'input' and 'output' are interfaced with active electronics before and after the transformer isolation occurs and thus share the disadvantages of the Dupuis, Lane, Haigh and others.

The article H. Ishikuro, N. Miura, and T. Kuroda, "Wideband Inductive-coupling Interface for High-performance Portable System", IEEE 2007 Custom Integrated Circuits Conference (CICC) shows an inductive coupling system in which chips are designed with inductive elements which enable direct face to face chip to chip communications. In this case the inductor on chip is an individual element and not combined with an integrated second inductive element on the same IC. This reference also shows separate coils for applications outside a package. In this case, the coils are fabricated separately and interfaced conductively with drive electronics.

U.S. Pat. No. 5,361,277 (Grover) entitled "Method and apparatus for clock distribution and for distributed clock synchronization" describes a system in which the timing is coordinated such that transmitters and receivers are coordinated so that even with distant systems a common time and clocking reference is obtained. In a similar manner, U.S. Pat. No. 5,243,703 (Farmwald et al.) entitled "Apparatus for synchronously generating clock signals in a data processing system" and U.S. Pat. No. 5,954,804 (Farmwald et al.) entitled "Synchronous memory device having an internal register" describe a system in which timing is coordinated through the knowledge of clock edges following different paths. It should also be noted that the Grover and Farmwald patents describe wired systems such as direct wired memory or logic systems which further limit their systems. Wired systems as shown in the prior art are encumbered by the need for ESD structures which limit speed and increase power consumption.

U.S. Pat. No. 6,882,239 (Miller et al.) entitled "Electromagnetically coupled interconnect system" describes electromagnetic coupling between components in a test system in which the IC is contained in a package with a separate electromagnetic (EM) coupler. In general, this patent provides loosely coupled signals in which there is at least 10 dB of attenuation and further loss because of extra shielding. The goal of Miller et al. is to receive loosely coupled signals and is restricted for the case of testing and measuring other signals without major interference to those other signals which are required to be not perturbed.

U.S. Pat. No. 7,200,830 (Drost et al.) entitled "Enhanced electrically-aligned proximity communication and United States publication no. 20060224796 (Vigouroux et al.) entitled "Network chip design for grid communication" describe systems for self described 'proximity' communications which are close field capacitive coupling to enable the communications path. These are targeted at coupling chips capacitively to enable high speed communications, and require nearly intimate coupling contact to enable sufficient capacitive field interaction for communications.

Another form of near field interconnect package is shown in United States publication no. 20060022336 (Franzon et al.) entitled "Microelectronic packages including solder bumps and AC-coupled interconnect elements" and 20030100200 (Franzon, et al.) entitled "Buried solder bumps for AC-coupled microelectronic interconnects". These include solder bumps and AC-coupled interconnect elements. In the same vein is U.S. Pat. Nos. 6,885,090 (Franzon et al.) entitled "Inductively coupled electrical connectors" and 6,927,490 (Franzon et al.) entitled "Buried solder bumps for AC-coupled microelectronic interconnects". The Franzon packages are dependent on separately constructed and maintained structures. In U.S. Pat. No. 6,885,090, an essential element is to keep the structures separate because they will conduct if touching. The Franzon applications discuss a specific package technique and interconnect topology solder posts.

SUMMARY

The interconnect described below uses a miniature integrated monolithic interface element, hereinafter referred to as "MIMICE," comprising one or more elements that are conductive, insulating, inductive, and capacitive providing high speed I/O capability to integrated circuits. The MIMICE is a primary component of the interconnect, and may be formed on a single chip, or partially formed on two physically distinct chips. The MIMICE structure, shown for simplicity as coupled inductors, is two half-cell elements containing, for example, inductive+capacitive+conductive elements monolithically built into the IC or package or communications substrate. The term MIMICE is used for convenience in the description herein. However, as will be apparent, it may or may not be formed monolithically.

In one embodiment, both half cells are constructed in one monolithic IC with one half-cell connected to the internal chip circuitry and the other half-cell connected to pads of the IC, which are then connected to external elements. In other embodiments, the second half-cell may be connected to intermediate conductors including MIMICE devices themselves. In other embodiments, the second half cell may be configured into a substrate device or a second IC.

MIMICE, in contrast to current methods, involves using coupling inside the chip in such a way as to reduce or eliminate the need for an Electro-Static-Discharge (ESD) circuits structure (prior art FIGS. 1a, 1b) inside the I/O cell for high-speed communication. This is done by constructing the MIMICE out of elements such as conductive, insulating, inductive and capacitive elements, which exist in the microfabrication of IC's and constructing these elements simultaneous with the active IC circuitry. FIG. 2a shows an application in which all the elements are constructed using the standard IC process flow without the need for separate elements and connections as needed in the prior art.

Electrical isolation between input and output inside the MIMICE I/O cell framework of the cell provides inherent discharge voltage protection. Since there is no direct electrical connection between the input and the output half cells (or components), the isolation gap between the primary (Tx) and the secondary (Rx) components of MIMICE is sufficient for transient voltage and differential voltage protection. Additional isolation between input and output connections can be achieved by increasing the separation distance between the primary (Tx) and secondary (Rx) by moving them further apart, for example by increasing the number and/or thickness of layers of a chip separating Tx and Rx, thus increasing the isolation barrier. The isolation layer can comprise silicon dioxide, which is a common component of semiconductor device manufacturing processes. It is possible to increase the isolation barrier by utilizing a material other than silicon dioxide in the gap region.

In current devices ESD circuit structures typically introduce signal delay; increases the required I/O cell size; and at the same time causes the I/O cell to use considerable power especially at high frequencies or high data rates. In fact current I/O cell speed capability in standard low power integrated circuits is limited to approximately 500 MHz. Replacing Tx and Rx capability having protective ESD structure with MIMICE provides advantage of smaller size, less power consumption and significantly higher operating speed. Optionally, a very small ESD protection circuit structure at the secondary of the transformer (Rx) can be used to improve discharge voltage protection. For example an ESD structure of 1/10 the size of normal may be included in combination with MIMICE to exceptional protection levels over that of existing solutions.

The MIMICE scheme for communication also makes it possible to send more than one signal over the same pad concurrently at different frequencies. MIMICE makes this possible because of the reduced signal attenuation achieved by having removed the ESD loads. To achieve this, a conditioning mechanism is used at the receiving side of the MIMICE to extract the signals.

The circuit performance can be improved by using pre-emphasis techniques to shape the transmitted waveform to compensate for signal distortion and "smearing" due to interconnect parasitic elements and better match the transmission characteristics of the intervening communications medium.

According to one embodiment, there is provided an interconnect for transmitting an electric signal between electronic devices, comprising a first coupling element electromagnetically coupled to, and immediately juxtaposed to, a second coupling element. The first coupling element is mounted on and electrically connected to a first electronic device having a first integrated circuit. The second coupling element is mounted on and electrically connected to a second electronic device having a second integrated circuit. Each of the first electronic device and the second electronic device has a first face and a second face, the first face of the first electronic device being immediately adjacent to the first face of the second electronic device. The first coupling element is recessed from the first face of the first electronic device, such that the first coupling element and the second coupling element are separated by a dielectric barrier.

According to another aspect, there is provided a method of transmitting an electric signal between a first electronic device and a second electronic device, comprising the steps of: providing a first coupling element electrically connected to the first electronic device; providing a second coupling element electrically connected to the second electronic device, the second coupling element being immediately juxtaposed to the first coupling element, the first coupling element and the second coupling element being separated by a dielectric barrier; providing the first electronic device with a coupling device electrically connected to the first coupling element; and operating the coupling device to drive the first coupling element with one of a modulated continuous wave and an ultra-wideband pulse to electromagnetically couple the first coupling element and the second coupling element.

According to another embodiment, there is provided an interconnect for transmitting an electric signal between electronic devices comprising a first coupling element electromagnetically coupled to, and immediately juxtaposed to, a second coupling element. The first coupling element is mounted on and electrically connected to a first electronic device having a first integrated circuit. The second coupling element is mounted on and electrically connected to a second electronic device having a second integrated circuit. A coupling device is electrically connected to the first coupling element. The coupling device comprises one of a digital to ultra-wideband pulse converter and a RF modulator, such that in operation, the coupling device drives the first coupling element with one of an ultra-wideband pulse and a modulated RF signal to electromagnetically couple the first coupling element and the second coupling element.

According to another aspect, there is provided a method of transmitting an electrical signal between a first electronic device and a second electronic device, each electronic device having an integrated circuit. The method comprises the steps of: providing a first coupling element and a second coupling element on the first electronic device, the first coupling element being electrically connected to the integrated circuit of the first electronic device, the first coupling element being immediately juxtaposed to the second coupling element, the first coupling element and the second coupling element being separated by a dielectric barrier; providing a third coupling element and a fourth coupling element on the second electronic device, the fourth coupling element being electrically connected to the integrated circuit of the second electronic device, the third coupling element being immediately juxtaposed to the second coupling element, the third coupling element and the fourth coupling element being separated by a dielectric barrier, the third coupling element being electrically connected to the second coupling element; providing the integrated circuit of the first electronic device with a coupling device electrically connected to the first coupling; and driving the first coupling element with the coupling device such that an ultra-wideband pulse is coupled from the first coupling element to the second coupling element, electrically transmitted from the second coupling element to the third coupling element, and coupled from the third coupling element to the fourth coupling element.

According to another embodiment, there is provided an interconnect for transmitting an electrical signal between a first electronic device and a second electronic device, each electronic device having an integrated circuit. The interconnect comprises a first coupling element and a second coupling element on the first electronic device. The first coupling element is electrically connected to the integrated circuit of the first electronic device. The first coupling element is immediately juxtaposed to the second coupling element. The first coupling element and the second coupling element are separated by a dielectric barrier. The interconnect further comprises a third coupling element and a fourth coupling element on the second electronic device. The fourth coupling element is electrically connected to the integrated circuit of the second electronic device. The third coupling element is immediately juxtaposed to the second coupling element. The third coupling element and the fourth coupling element are separated by a dielectric barrier. The third coupling element is electrically connected to the second coupling element. There is a coupling device comprising a digital to ultra-wideband pulse signal converter. The coupling device is electrically connected to the first coupling element, such that in operation, the coupling device drives the first coupling element with an ultra-wideband pulse to electromagnetically couple the first coupling element and the second coupling element.

Other embodiments and features will be apparent from the description and the claims.

BRIEF DESCRIPTION OF DRAWINGS

These and other features will become more apparent from the following description in which reference is made to the appended drawings, the drawings are for the purpose of illustration only and are not intended to be in any way limiting, wherein.

DETAILED DESCRIPTION

Figure 1A:
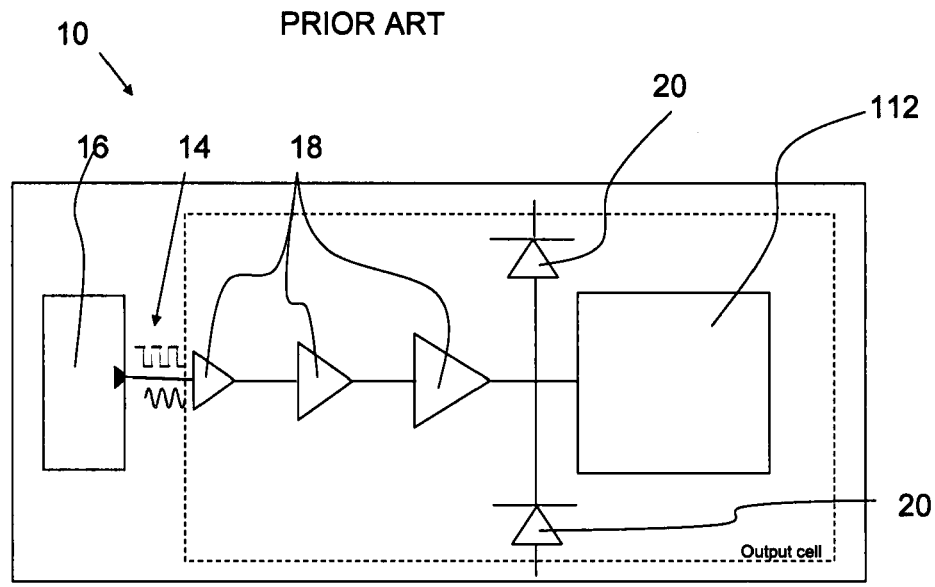
FIG. 1a, labelled PRIOR ART, is a diagram of conventional means for signal and data input.

There exists a body of prior art concerning the use of inductive or capacitive coupling techniques within and exterior to a chip or device for communication of signals either between multiple devices or across multiple technology domains. However, none of these possesses all the properties and capabilities of the device described herein. Typical prior art methods or apparatus involve disparate elements which in combination provide isolation or communication. A typical alternative would have perhaps four discrete elements, such as transformers or capacitors, and wired connections to an external transformer or capacitor and the reverse, another external element and finally and interface to a second IC. These techniques are not integratable into one element, and must be distributed between two ICs or two systems and typically require separate packaging or processing. The teachings herein can utilize one process to construct the MIMICE and the transmitting and receiving elements at the same time.

The present device is a high-speed input and/or output device comprising a miniature integrated monolithic interface element, hereinafter termed MIMICE and referenced in diagrams using reference numeral 32. It will be understood that the device can either be created monolithically or created separately and combined monolithically. The device generally has a lower capacitance, uses less power, and can transmit at a higher rate than devices in the prior art.

One way in which capacitance can be reduced is by omission of electrostatic discharge diodes 20 as shown in FIG. 1. However, for conventional apparatus 10 this would endanger all electronic components by removing protection from exposure to high voltage events. Within the monolithic MIMICE 32 device, thick oxide (a standard microfabrication element) can be used to separate the half cells. One of the half cells may be subject to an ESD event, and the corresponding half cell is not subject to the ESD event because of a dielectric barrier between the half cells. Such barrier is typically thick oxide of ~1 um and can have ESD immunity to the kilovolt level which is much higher than the few volts of input or output devices without ESD.

Because of the presence of ESD devices and associated parasitic in modern ICs, the prior art devices discussed above have limitations. The device described herein substantially reduces the parasitics and thus can operate at higher speeds and consume less power. For example, a 90 nm process IC may transmit signals chip to chip using 3.3 volt signalling The rule of thumb is that the speed of such signalling is limited to approximately 200 MHz and consumes large amounts of power. When many I/O are used, the power consumed by the I/O cells can contribute 50% or more of the total power consumption of an integrated circuit. With the current technique, the coupling field is based on both the voltage and the current used. In other words, the present device can increase the current (electron flow) and resultant level of the transmit signal in a manner to compensate for the lower supply voltage. The device may also utilize the fact that the turn's ratio and coupling of its constituent conductors can be set such that the 1 volt supply is effectively scaled upward or downward on the output lines. Thus, the device is different from and superior to that of prior art capacitive 'proximity' communications.

With reference to FIGS. 2 through 7g we will now describe different embodiments of MIMICE 32 for use in high-speed signal I/O devices having integrated circuit bodies 400.

To exemplify the use of MIMICE 32 we will describe: use in an apparatus 30 for high speed signal output (FIGS. 2a through 2c, 4, 5a, 5b, 6a and 6b); use in another apparatus 130 for high speed signal input (FIGS. 3a through 3c); and use in another apparatus 230 for bi-directional high speed input/output (I/O) (FIGS. 7a through 7f).

Figure 8A:
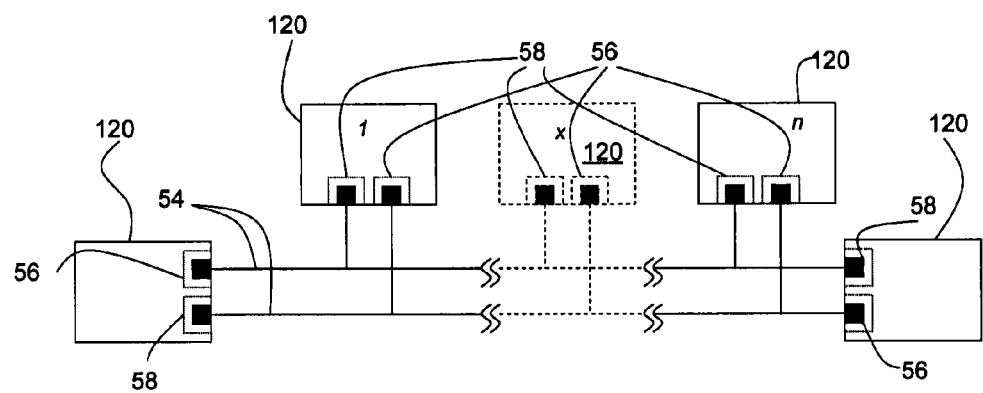
FIG. 8a shows a device comprised at least one MIMICE apparatus in communication via wired interconnections with a plurality of other devices having MIMICE apparatus.
Figure 8B:
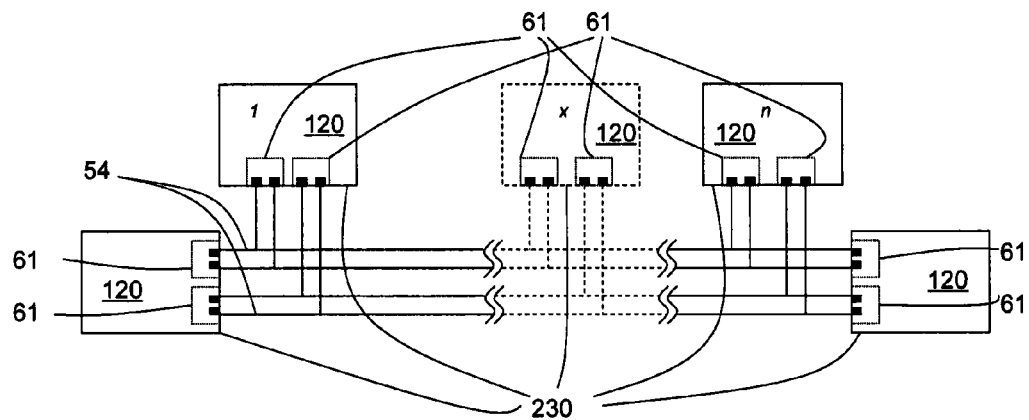
FIG. 8b shows a device comprising at least one differential MIMICE apparatus in communication via interconnection with a plurality of other devices having MIMICE apparatus.
Figure 8C:
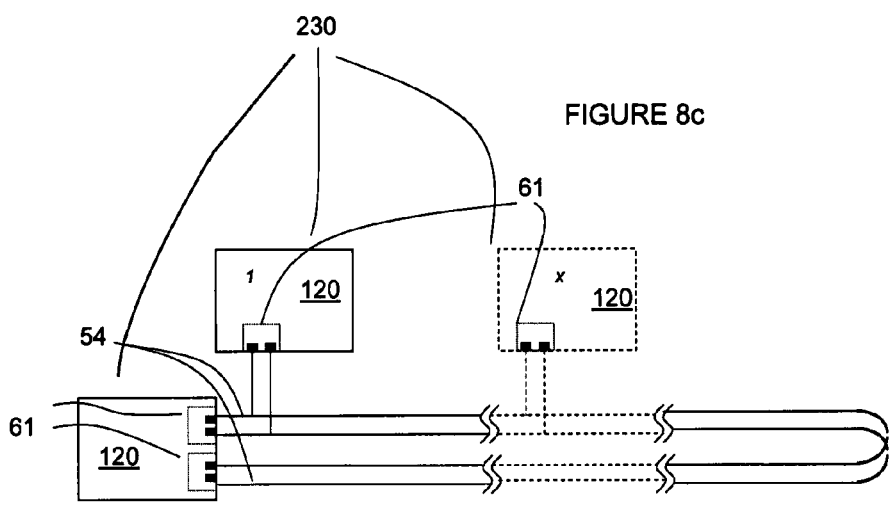
FIG. 8c shows a device comprising at least one differential MIMICE apparatus in communication via interconnection with a plurality of other devices having MIMICE apparatus using a loop connection topology.

Architectures for communications between a plurality of devices using MIMICE 32 are illustrated in FIGS. 8a and 8b. FIG. 8c shows how MIMICE 32 can be configured in a loop system in which one set of devices can act at one end of a looped communications system. This application of MIMICE 32 provides a very high speed communications network among multiple circuits either integrated within the same chip body or as separate chips or a combination and can be coupled with techniques for synchronization or distributed timing or master slave coordination's between separate elements.

Figure 9A:
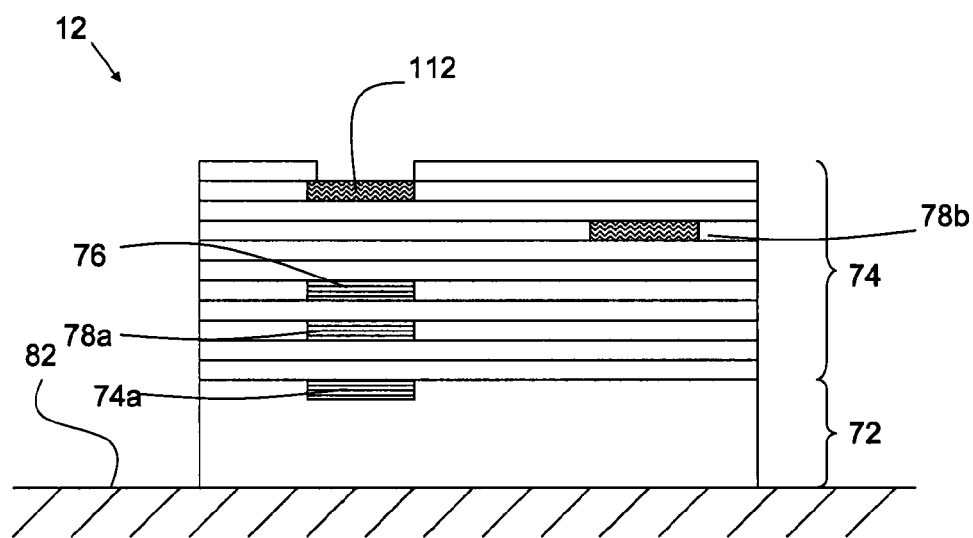
FIG. 9a is a vertical cross-section diagram of an electronic circuit having MIMICE architecture for high-speed signal input/output.
Figure 9B:
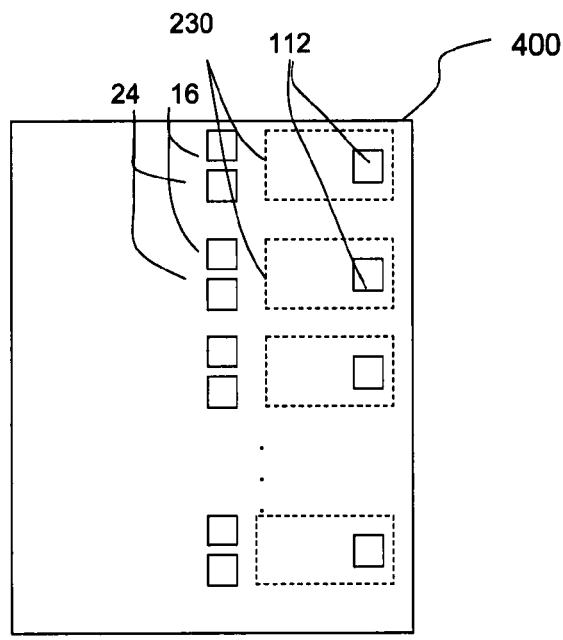
FIG. 9b is a diagram showing multiple MIMICE cells providing massively parallel communications from one monolithic integrated circuit.
Figure 10:
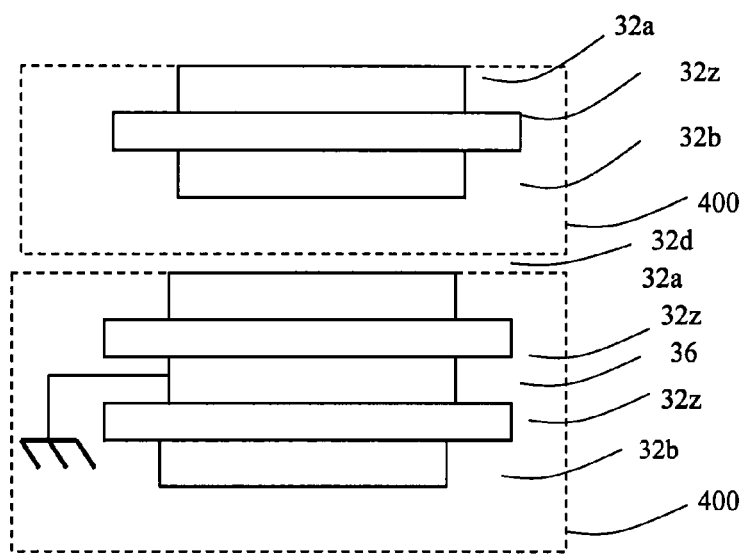
FIG. 10 illustrates two examples of layered chips or monolithic structures.

Examples of the layered structure of devices having MIMICE 32 are illustrated in FIGS. 9a and 10. FIG. 9b shows how multiple MIMICE 32 and their related high speed I/O circuits may be included in one monolith to enable parallel forms of communications.

Figure 11A:
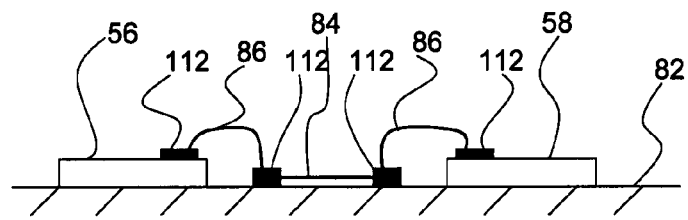
FIG. 11a is a diagram illustrating interconnection between chips on a common substrate.
Figure 11B:
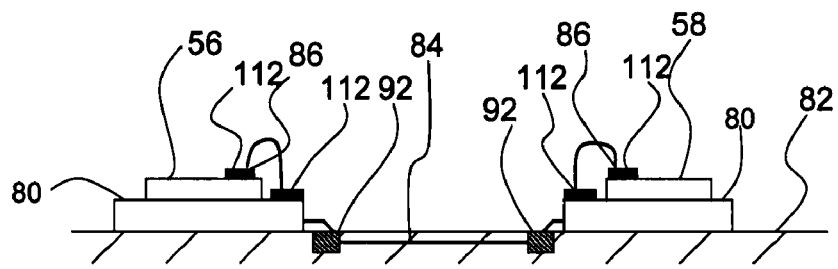
FIG. 11b is a diagram illustrating interconnection between a chip in package and another chip in package on a common substrate.

Presently the following will describe how devices including MIMICE 32 are in communication with other devices on the same substrate with reference to FIGS. 11a through 11f. In FIG. 11g the interconnections of MIMICE are for the case where different parts of the same IC.

Figure 12A:
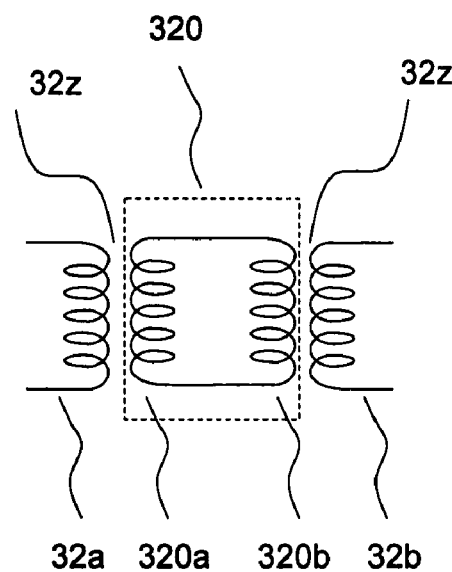
FIG. 12a is an example of using interstitial device for extended isolation/protection.

Use of an interstitial set of half cells (MIMICE 32) for enhanced isolation, separation and protection of electrical elements is illustrated in FIG. 12a.

Figure 2A:
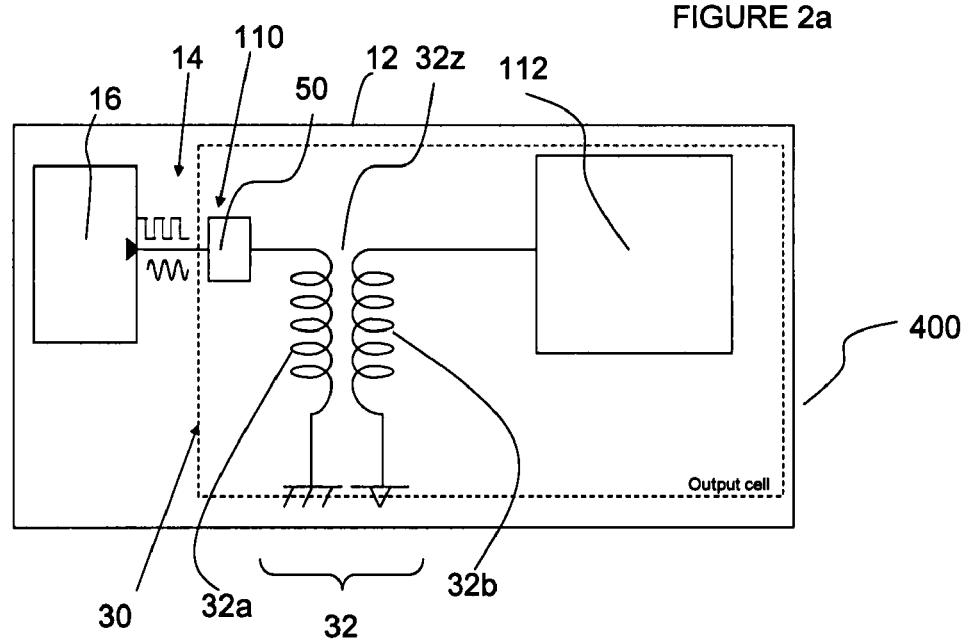
FIG. 2a is a diagram of an output cell having a MIMICE apparatus for high-speed signal output.
Figure 2B:
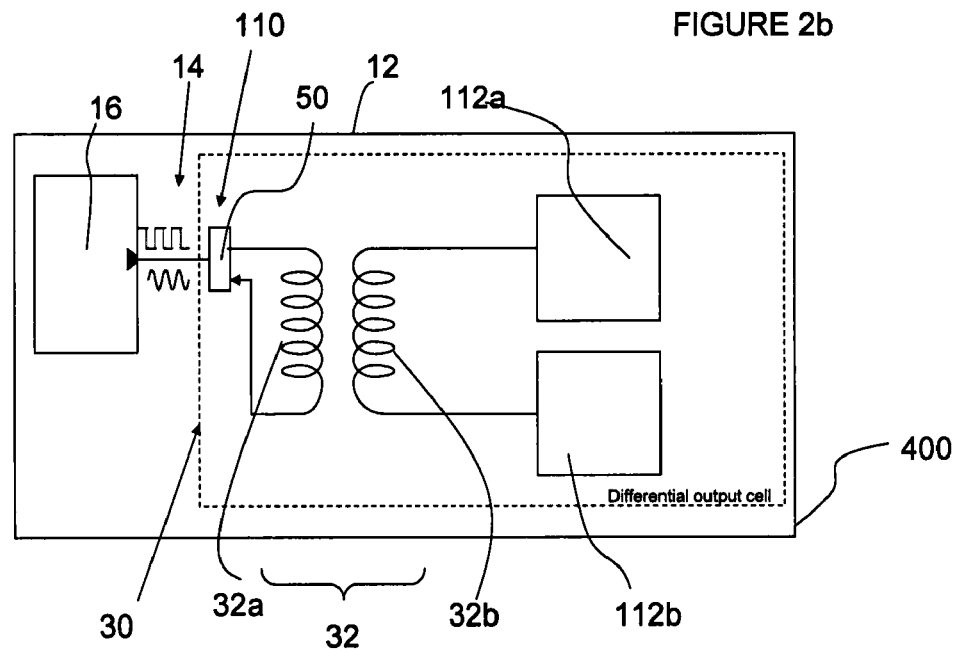
FIG. 2b is a diagram of a differential output cell having a MIMICE apparatus for high-speed signal output.
Figure 2C:
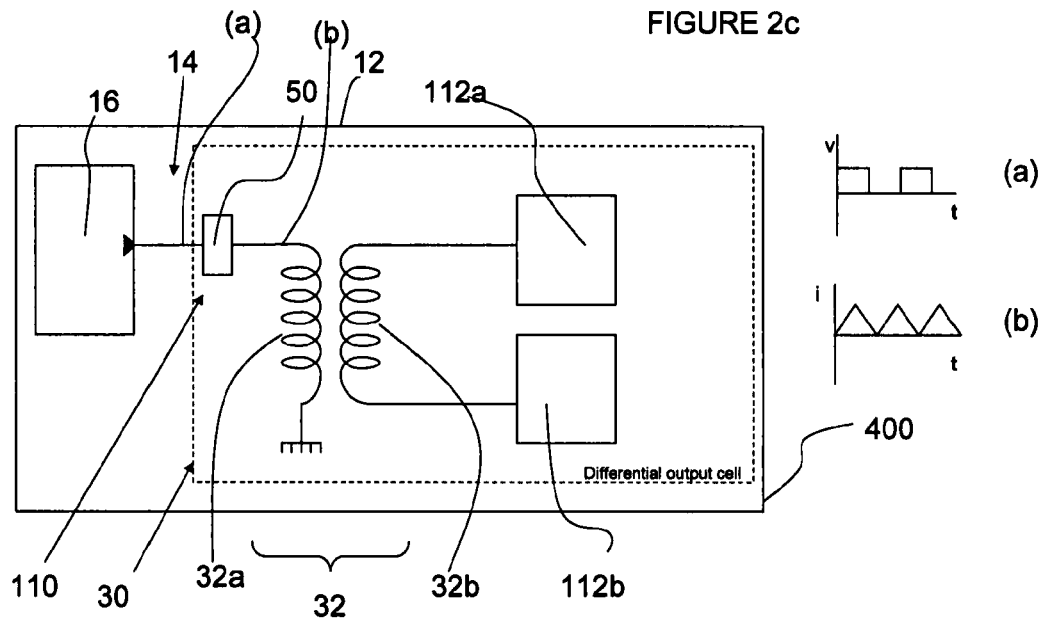
FIG. 2c is a diagram of another embodiment of a differential output cell having a MIMICE apparatus for high-speed signal output.

High speed signal output cell apparatus 30 illustrated in FIGS. 2a, 2b and 2c each comprise output signal path 110, MIMICE 32 and at least one pad 112, 112a, 112b for communicating signal 14 to external devices. Output signal path 110 comprises an application specific circuit 16 for transmission of output signal 14, signal converter 50. Output signal 14 originates from first circuit 16 and transformed by signal converter 50. The output of the signal converter 50 is electrically coupled to first half-cell 32a of MIMICE 32 and thus coupled electromagnetically to the juxtaposed second half-cell 32b of MIMICE 32. Second half-cell 32b of MIMICE 32 is electrically coupled to pads 112 as in FIG. 2a or to pads 112a and 112b as in FIGS. 2b and 2c. For illustration purposes, the half cells are shown as inductive elements. First winding or "half-cell" 32a and second winding or half-cell 32b is separated by dielectric isolation medium 32z. In the embodiments described herein, it will be understood that the two half-cells 32a and 32b that make up MIMICE 32 are immediately juxtaposed to each other, whether they are on separate chips as shown in, for example, FIG. 10, or located on the same chip as shown, for example, in FIG. 2a. This improves their ability to electromagnetically coupling as a signal is transmitted between them. The dielectric medium can be one of several known materials used in the manufacture of electronic monolithic devices, for example Silicon Dioxide, which is used to build monolithic silicon chips and has a dielectric constant and thickness that can withstand large potential difference. Alternatively, where practical, the dielectric medium may be air, or a combination of air and a solid medium.

It will be noted that air or other dielectric materials can be used as a dielectric medium as well in place of silicon dioxide described earlier, especially if one of the well known microfabrication techniques is used to provide precision placement between the half cells. Micro-fabrication techniques such as anodic bonding can make atomic level bonding between the two half cells allowing MIMICE 32 half cells to be fabricated separately and later combined into one monolithic element with the advantages of dielectric isolation and high coupling coefficient for signal transfer. Alternatively, covalent chemical bonding can be used to bond materials at the molecular level and may be used in a similar manner.

In high-speed output apparatus 30 illustrated in each of FIGS. 2a through 2c, signal converter 50 has low capacitance, and so induces less delay than chain of buffers 18 in prior art apparatus 10 illustrated in FIG. 1. Signal 14 is then transmitted between signal converter 50 and pad 112 by coupling (inductive coupling is an illustrative example) through MIMICE 32. Inductive coupling occurs through a change in current at one side of MIMICE 32 inducing a change in current at the other side of MIMICE 32. A high voltage at one side of MIMICE 32 does not induce a high voltage at the other side, thus there is voltage isolation and so no electrostatic discharge diodes are required between MIMICE 32 and pad 112.

Referring to FIG. 2a, a non-differential embodiment of apparatus 30 for high-speed output has a MIMICE 32 interposed between pad 112 and an output signal path 110 having at least one signal converter 50 for transforming signal 14. Signal converter 50 may comprise a simple element such as a buffer or a more complex element such as a continuous carrier RF modulator or preferentially an ultra wide band pulse generator. For non-limiting purposes of illustration, all figures, this description, and the following descriptions of the present device use a nominal equivalent of a transformer or coupled inductors to illustrate MIMICE 32. To those skilled in the art, it will be apparent that MIMICE 32 can be a significantly less complex combination of the constituent components integrated to provide high efficiency coupling and a high level of ESD protection while being small and using minimal power. Furthermore, while the embodiments discussed below and illustrated in the corresponding figures show an inductor, this is only illustrative of the concept. The actual coupling achieved by the MIMICE 32 devices may be a complex interaction of electromagnetic capacitive and inductive coupling. This is demonstrably different than the 'proximity' capacitive coupling.

Shown with MIMICE 32 are connections to grounds shown as two different symbols. With a MIMICE 32 structure having dielectric isolation, it is possible for the elements to be connected to different grounds and operate at different potentials. This enables both signalling level differences and enhanced signal return paths. With some embodiments the grounds are shared, in others they are separated, in yet others they are tied with impedances to reduce deleterious effects of ground currents. The MIMICE 32 structure gives an additional design freedom dimension not available for strictly wired or strictly dielectric isolated methods.

Referring to FIG. 2b, high-speed signal output apparatus 30 has a differential embodiment of MIMICE 32 and two pads 112a, 112b. Signal converter 50 drives the MIMICE 32 differentially. For example, using a "H-Bridge". Driving the MIMICE 32 differentially has several benefits including improved voltage swing, efficient power transmission transmit and improved common mode rejection at the receiver when compared to single ended configurations. Alternatively, referring to FIG. 2c, the inductive component at the output signal path 110 side of MIMICE 32 may be connected to the circuit's common signal return path. For example, Vss or Ground which may also include one or more connections to the substrate.

Figure 3A:
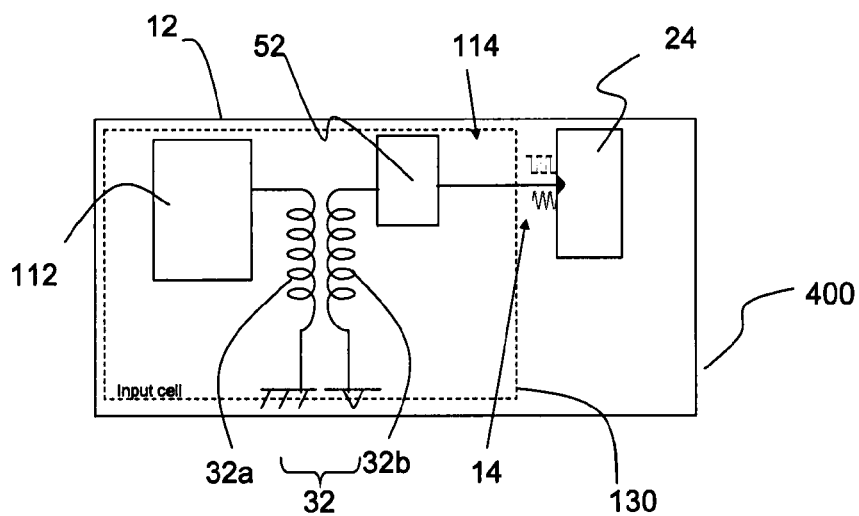
FIG. 3a is a diagram of an input cell having a non-differential MIMICE apparatus for high-speed signal input.
Figure 3B:
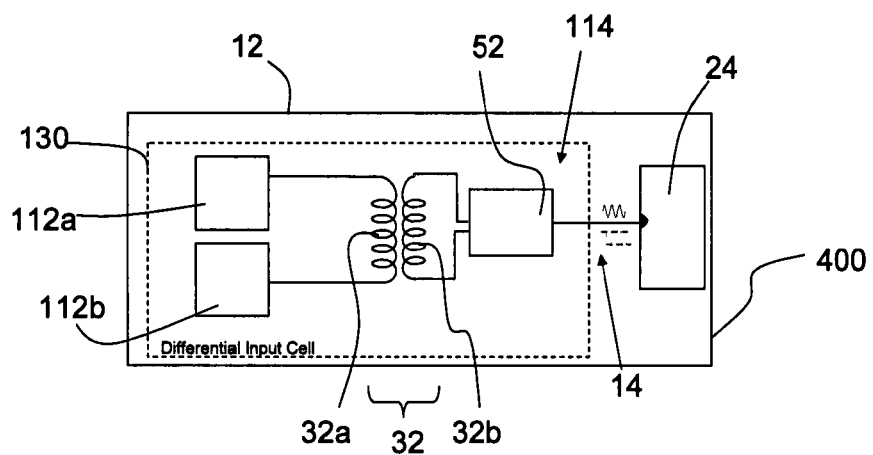
FIG. 3b is a diagram of a differential input cell having a MIMICE apparatus for high-speed signal input.
Figure 3C:
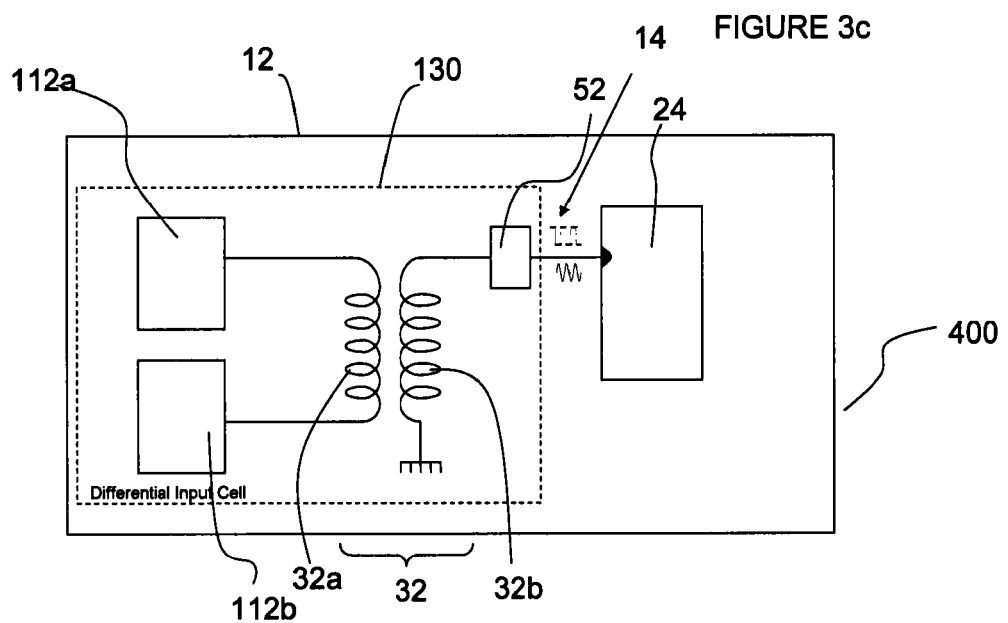
FIG. 3c is a diagram of another embodiment of a differential input cell having a MIMICE apparatus for high-speed signal input.

Referring to FIGS. 3a through 3c, a high speed input cell apparatus 130 comprises at least one pad 112 at which a signal is received, MIMICE 32 and an input signal path 114. Pad 112 is electrically coupled to first half cell 32a of MIMICE 32 and thus a signal present at pad 112 is preferentially coupled electromagnetically to the juxtaposed second half-cell 32b of MIMICE 32. Second half-cell 32b of MIMICE 32 is electrically coupled to input signal path 114. Input signal path 114 has a signal converter 52 (preferentially an ultra wide band pulse receiver, or alternatively, a continuous carrier RF demodulator)) and application specific circuit 24. When one pad 112 is electrically connected to first half cell 32a of MIMICE 32, input apparatus 130 is non-differential as illustrated in FIG. 3a. When two pads 112a, 112b are electrically connected to first half cell 32a of MIMICE 32, apparatus 130 is differential as illustrated in FIGS. 3b and 3c. FIG. 3c, as an example, does not include the signal converter 52, which may not be required where the signal is of sufficient magnitude or the application requires minimal complexity. In FIGS. 2a-3b and other figures, signal converter 50 is used to represent an "input" signal converter, and signal converter 52 is used to represent an "output" signal converter. However, it will be understood that either may act as an input or output signal converter, or both, depending on the situation, as will be described below.

The structures and methods described herein are preferably used with a continuous carrier wave, or with ultra-wideband (UWB) pulses. The term UWB is generally used to describe a radio technology that can be used at very low energy levels for short-range high-bandwidth communications by using a large portion of the radio spectrum, and is defined by the FCC as a pulse with a bandwidth that exceeds the lesser of 500 MHz or 20% of the center frequency. UWB pulses are generally used in applications that target sensor data collection, precision locating and tracking applications. In the devices described herein, UWB pulses are used for ultra short range communications. In other words, the UWB pulses are used to transmit data locally, i.e., much less than the wavelength of the principal pulses for the coupled connection.

The continuous carrier wave is an RF signal. Preferably, a higher frequency is used to allow for a higher data rate as well as a more efficient coupling, such as a frequency of 500 MHz or greater, or more preferably, a frequency of 1 GHz or greater. The continuous carrier wave may be modulated using any of the known modulation techniques which are practical to implement in a chip as described herein, as will be recognized by those skilled in the art.

The RF signal or the UWB pulses are produced by a coupling device that generates a signal in the transmitting half-cell in a MIMICE 32 to cause the two half-cells to become electromagnetically coupled and therefore transmit information across the dielectric barrier separating them. The coupling device may be a signal converter, such as a digital to UWB pulse converter, a modulator, or other device that performs similar functions, depending on the type of signal transmitted or modulation technique used. The receiving half-cell where the signal is received will also have a demodulator, or a signal converter to reconstruct the signal. Preferably, the half-cells will have a coupling coefficient of about 0.1 or greater, or more preferably, about 0.3 or greater. If, however, the coupling coefficient is lower, for example around 0.01, techniques may be used in the art to increase the signal strength, such as by using a low noise amplifier.

Figure 4:
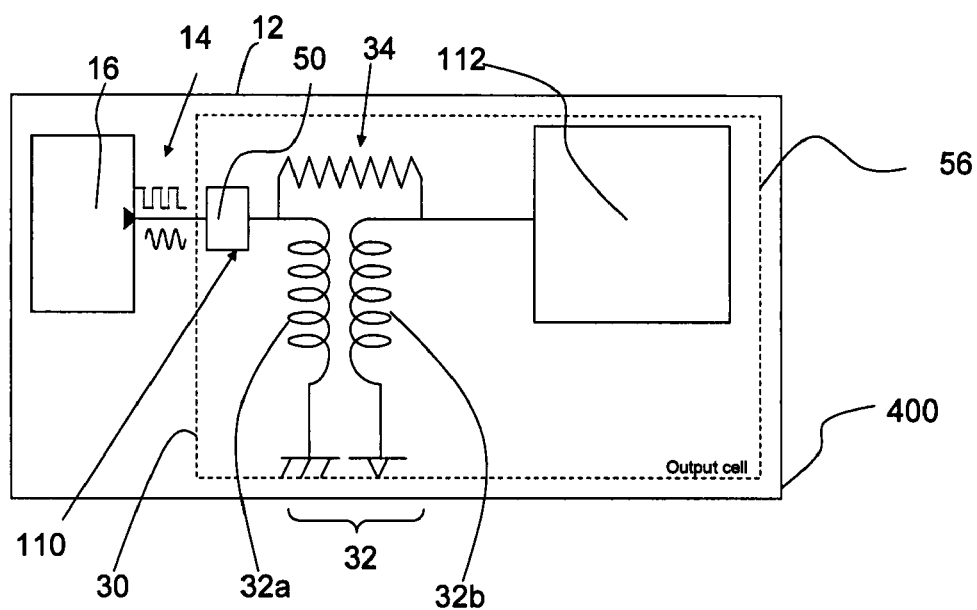
FIG. 4 is a diagram of an output cell having a MIMICE apparatus for high-speed signal output, having means for DC restoration or for providing DC information to both sides of MIMICE apparatus.

Referring to FIG. 4, another embodiment of MIMICE 32 apparatus 30 represents a method for providing DC restoration in a MIMICE 32 system. In an illustrative example, a resistor 34 has a large resistance, for example 100,000 ohms or higher, which provides DC restoration or DC information to both sides of MIMICE 32 while having a sufficiently large value of resistance to have a minimal negative effect on the protection against ESD and other damaging conditions inherent in the protection afforded by the MIMICE 32 concept.

Figure 5A:
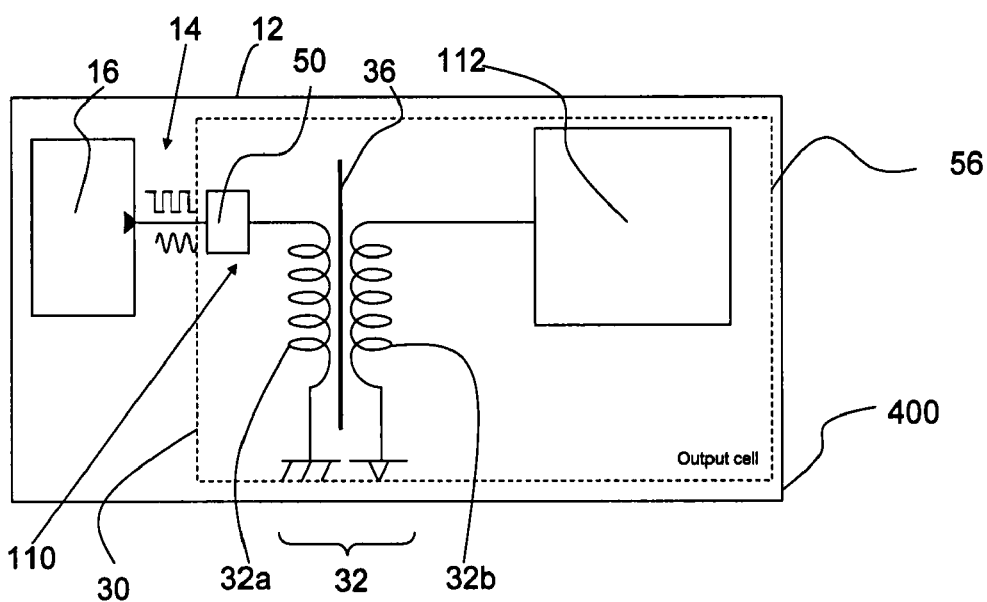
FIG. 5a is a diagram of an output cell with the MIMICE apparatus having a metal shield.
Figure 5B:
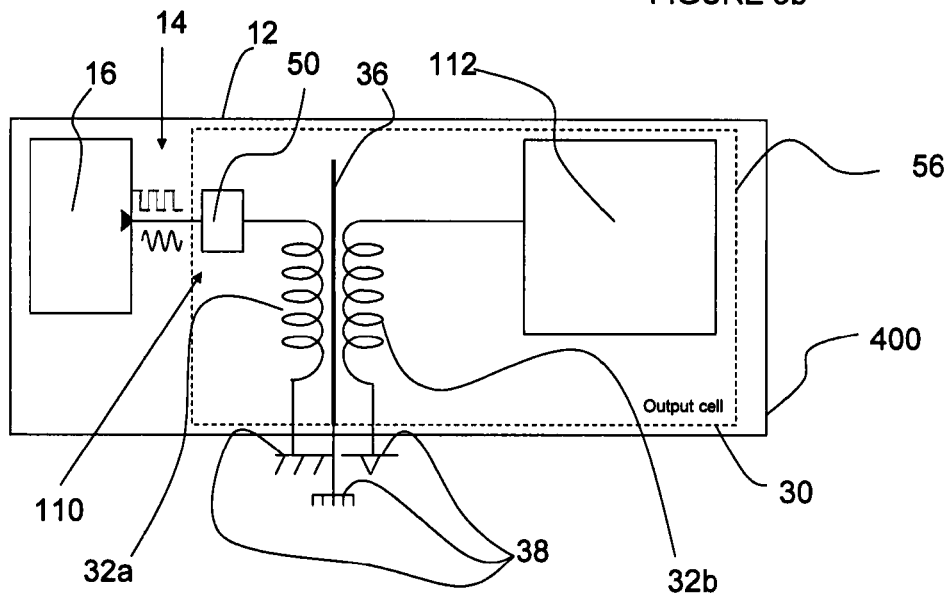
FIG. 5b is a diagram of an output cell with a MIMICE apparatus having a grounded metal shield.

The MIMICE 32 structure and method provides a mechanism to which additional shielding and protection beneficially may be added without compromising the benefits of the fundamental concept and MIMICE 32 architecture. The following examples illustrate options for adding a shield component to the MIMICE 32 system. In FIGS. 2a through 3c, no shield is present. In FIGS. 5a and 5b, MIMICE 32 architecture includes a shield 36 for protection against unwanted signals and a means to increase the dielectric separation while minimizing the coupling loss between the input and output ports of MIMICE 32. The working structure can include means for input, output, or a combination of input and output.

Optionally, the structure of MIMICE 32 may include a ground, a floating ground, or other protective connections, of which FIGS. 5*a* and 5*b* show examples of options available.

Referring to FIG. 5*a*, one option is to include a metal shield 36 between the first half cell 32*a* and second half cell 32*b* of MIMICE 32, thereby improving shielding. As in FIG. 2*a*, the MIMICE 32 device is shown with two different ground connections which may be configured as one common ground or separate depending on desired ground return conditions. The metal shield is not grounded.

Referring to FIG. 5*b*, each of first MIMICE 32 half cell 32*a*, second MIMICE 32, half cell 32*b* and metal shield 36 are grounded, thus forming a buffered electrostatic discharge protector. It will be recognized that similar protective measures can be taken by including metal shield 36 in MIMICE 32 of high-speed input apparatus 130 (not illustrated). In this figure, a third grounding connection is shown for the shield. This connection may be alternatively be left unconnected as in FIG. 5*a* or connected in common with another ground or connected to either of the half cell grounds.

Figure 1B:
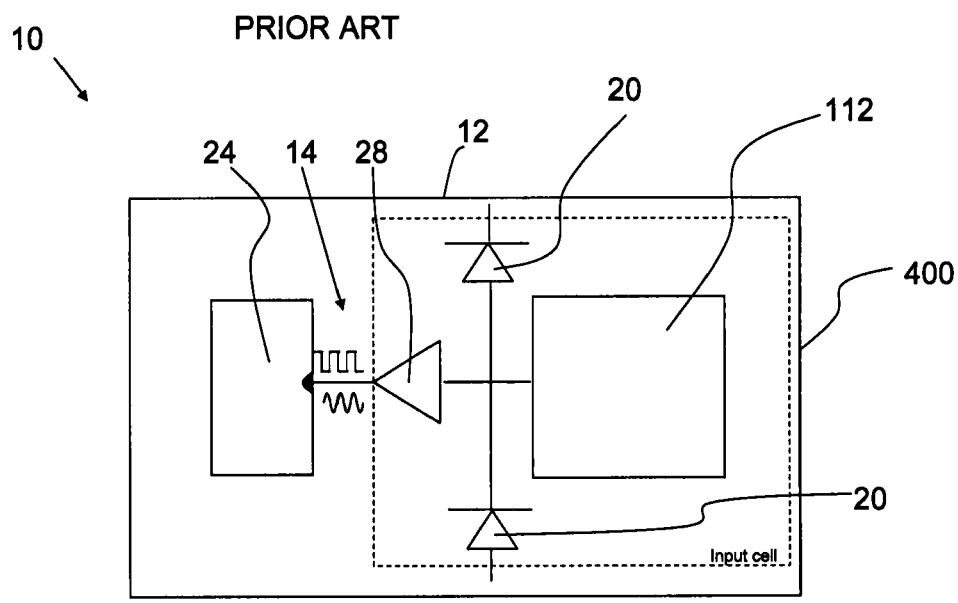
FIG. 1b, labelled PRIOR ART, is a diagram of conventional means for signal and data output.
Figure 6A:
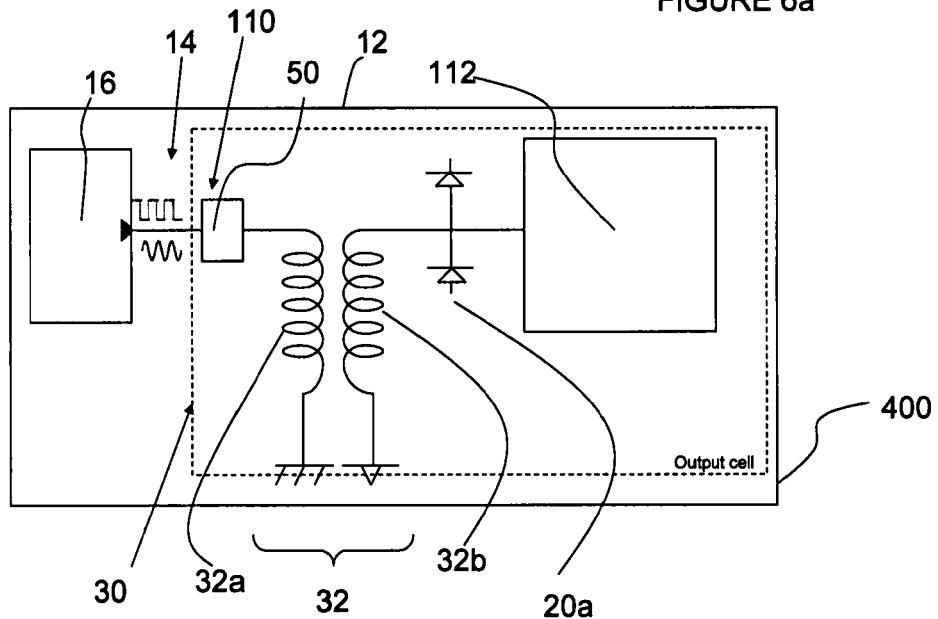
FIG. 6a is a diagram of another embodiment of an output cell having a MIMICE apparatus for high-speed signal output and an electrostatic discharge (ESD) apparatus for additional ESD protection.

Referring to FIG. 6*a*, additional protection against ESD may be provided using prior art device 20*a*, where device 20*a* for ESD protection typically is smaller than is required for protection of prior art devices as illustrated in FIGS. 1*a* and 1*b*. An example would be to have protective ESD of 1/10 or 1/100 of the prior art combined with MIMICE 32 to give exceptional protection at the same time as being very high speed and very low power. It will be recognized that similar devices to 20*a* can also be included in the high-speed output apparatus 30 (not illustrated) in MIMICE 32.

Referring to FIGS. 2*a* through 6*a*, pads 112, 112*a*, and 112*b* provide capability for connections to other circuits or devices on the same integrated circuit or on the same substrate or on other substrates as will be described later with reference to FIGS. 11*a* through 11*e*.

Figure 6B:
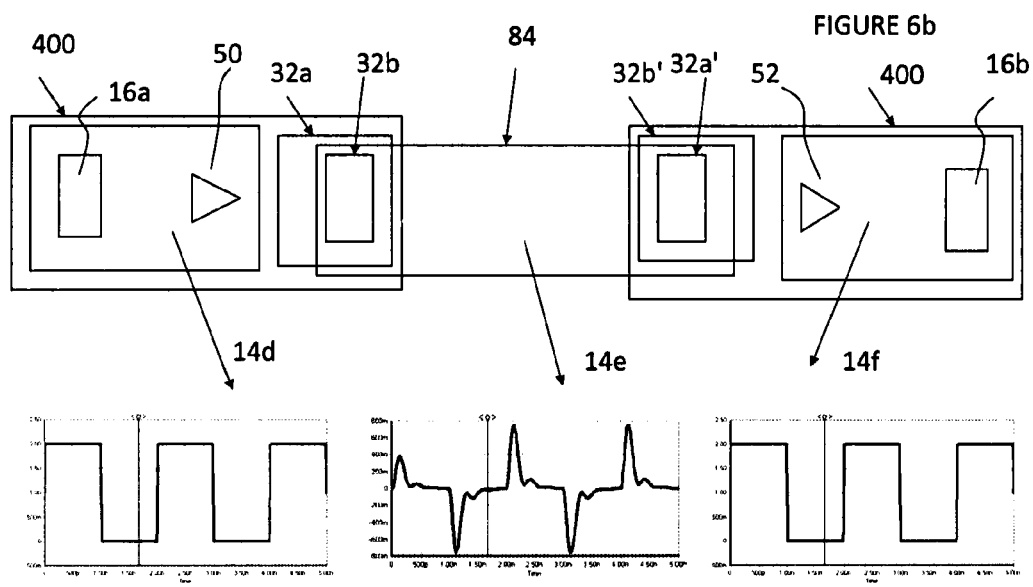
FIG. 6b is a diagram of an embodiment of an output cell having a MIMICE apparatus for high-speed signal output, a connecting coupler and a separate input cell having a MIMICE apparatus for high speed sign reception and reconstruction.

Referring to FIG. 6*b*, two separate integrated circuit bodies 400 each containing internal electronic circuits 16*a* and 16*b* for both transmitting (e.g., circuit 16*a*) and receiving (e.g., circuit 16*b*), signal converter 50, signal converter 52, MIMICE half cell output 32*a* and coupling 32*b*, MIMICE half cell input 32*b'* and coupling 32*a'*, signal 14*d*, to be transmitted, signal 14*e* in the middle of the coupler 84, data output 14*f*, and a separable coupler 84 with half cells at each end. This figure shows how to connect two chips with a complete intercommunications system. Note that ESD structures are not required to obtain high speed communications. Also shown are representative input signals 14*d*, signals 14*e* in the middle of the coupler 84, and output signals 14*f*. These signals, which were obtained by simulation, show that the device is able to support very high speed communication. In the simulation, a 1 GHz data signal is used. Examination of the middle signal shows that there is very high capacity in the signal (in this case a data transfer capacity) on the order of 500% of the represented 1 GHz signals. This experimentation shows the large data capacity of this device without the need of a RF carrier or other such power consuming or complicated system used by prior art implementations.

Referring to FIG. 7*a* through 7*g*, bi-directional communications within or between integrated circuit bodies 400 may be accomplished using apparatus 230 having MIMICE 32.

Figure 7A:
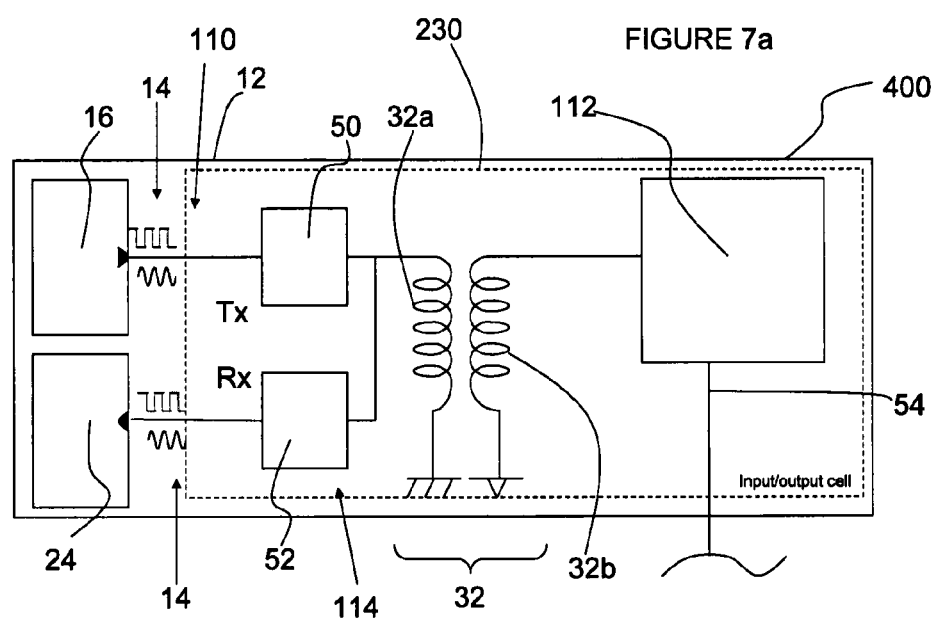
FIG. 7a is a diagram of a bi-directional cell comprising input and output capabilities in combination and having a MIMICE apparatus.

Referring to FIG. 7*a*, apparatus 230 has both signal output path 110 and signal input path 114 coupled to first half-cell 32*a* of MIMICE 32. Signal 14 output from application specific circuit 16 is coupled via output signal path 110 to MIMICE 32 thence to pad 112. Output signal path 110 comprises an application specific circuit 16 for transmission of output signal 14 and signal converter 50 (preferentially an ultra wide band pulse generator, or alternatively, a continuous carrier RF modulator). Output signal 14 originates from first circuit 16 and transformed by signal converter 50. The output of the signal converter 50 is electrically coupled to first half-cell 32*a* of MIMICE 32 and thus coupled electromagnetically to the juxtaposed second half-cell 32*b* of MIMICE 32. Second half-cell 32*b* of MIMICE 32 is electrically coupled to pad 112 as in FIG. 7*a* or to pads 112*a* and 112*b* as in FIG. 7*c*. A signal incoming at pad 112 is transmitted via MIMICE 32 and input signal path 114 to application specific circuit 24 Pad 112 is electrically coupled to second half cell 32*b* of MIMICE 32 and thus a signal present at pad 112 is preferentially coupled electromagnetically to the juxtaposed first half-cell 32*a* of MIMICE 32. First half-cell 32*a* of MIMICE 32 is electrically coupled to input signal path 114. Input signal path 114 has a signal converter 52 (preferentially an ultra wide band pulse receiver, or alternatively, a continuous carrier RF demodulator), and application specific circuit 24. When one pad 112 is electrically connected to second half cell 32*b* of MIMICE 32, input apparatus 230 is non-differential as illustrated in FIG. 7*a*. When two pads 112*a*, 112*b* are electrically connected to second half cell 32*b* of MIMICE 32, apparatus 230 is differential as illustrated in FIG. 7*c*.

Figure 7B:
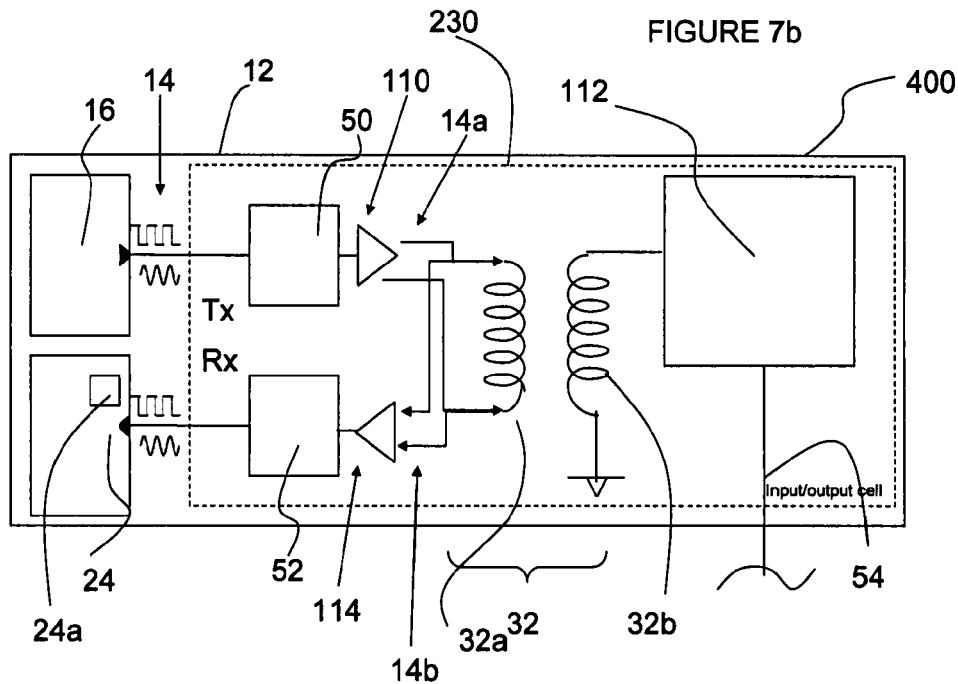
FIG. 7b is a diagram of another embodiment of a bi-directional cell comprising input and output capabilities in combination and having a MIMICE apparatus.
Figure 7C:
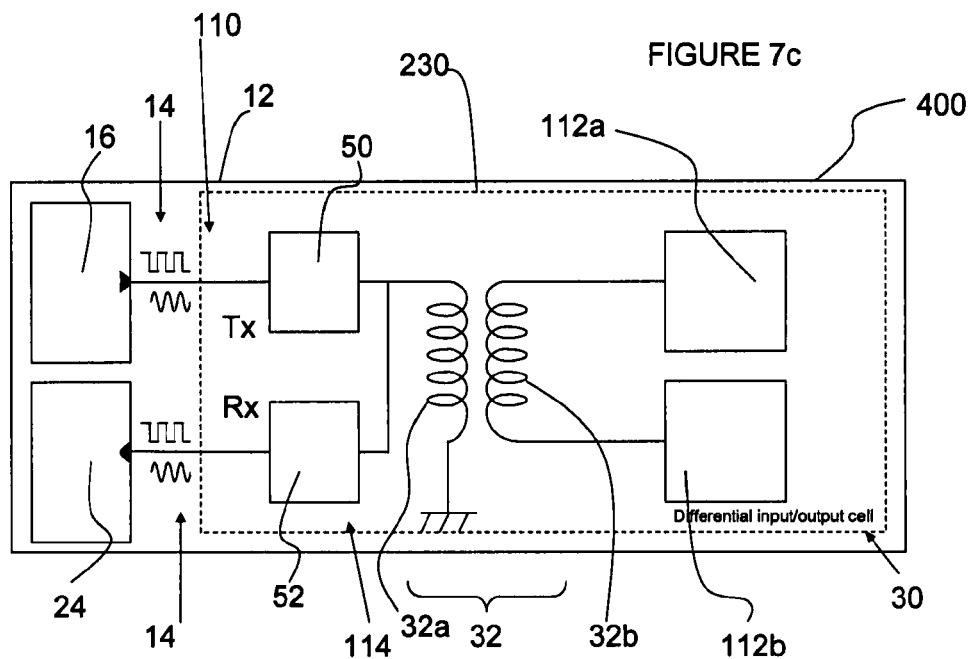
FIG. 7c is a diagram of a differential bi-directional cell comprising input and output capabilities in combination and having a MIMICE apparatus.
Figure 7D:
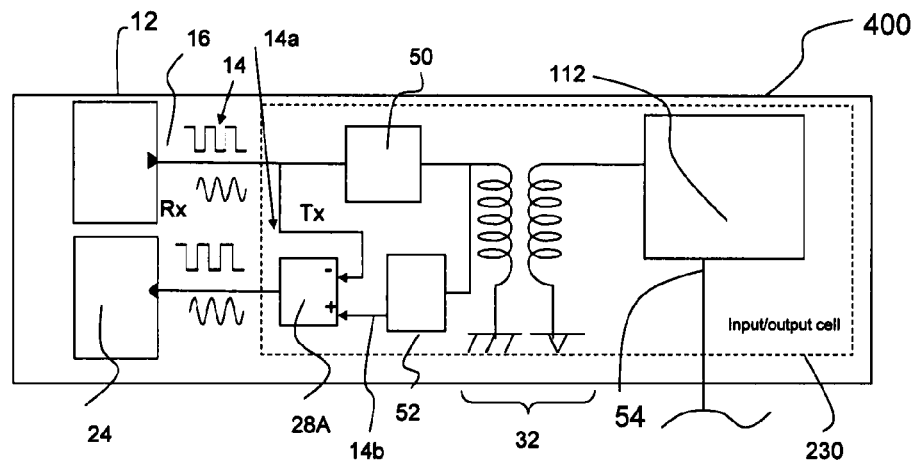
FIG. 7d is a diagram of a duplex bi-directional cell comprising input and output capabilities in combination having a MIMICE apparatus.
Figure 7E:
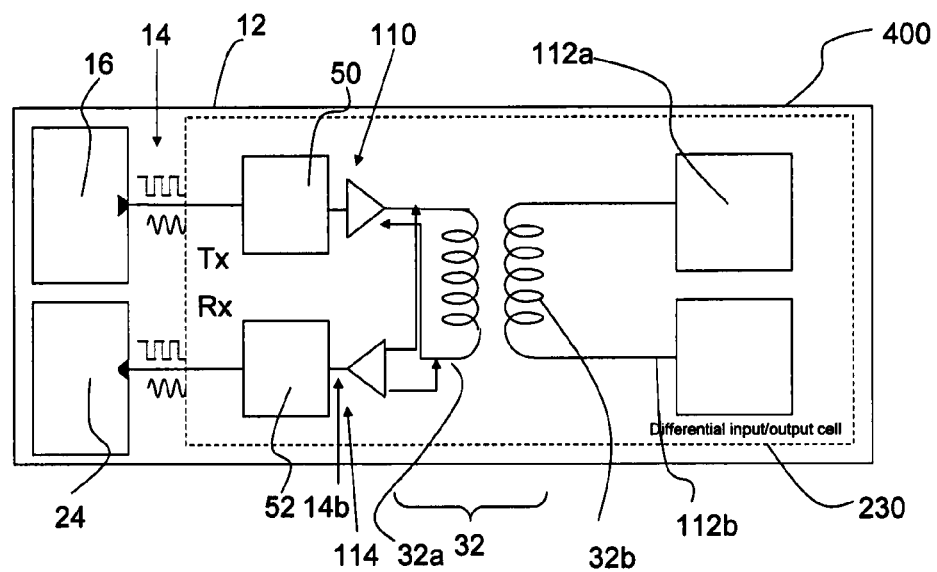
FIG. 7e is a diagram of another embodiment of a differential bi-directional cell comprising input and output capabilities in combination and having a MIMICE apparatus.
Figure 7F:
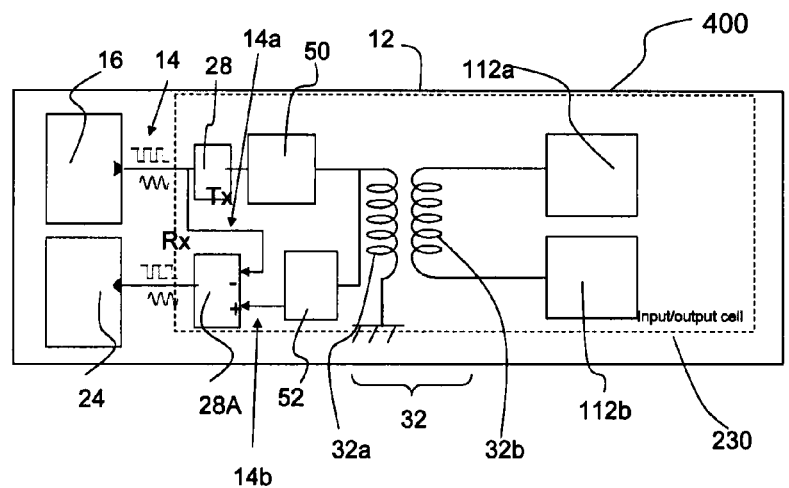
FIG. 7f is a diagram of a duplex differential bi-directional cell comprising input and output capabilities in combination and having a MIMICE apparatus.

Referring to FIG. 7*e*, for duplex simultaneous bi-directional communications using apparatus 230 has both signal output path 110 and signal input path 114 coupled to first half-cell 32*a* of MIMICE 32. Signal 14 is coupled via output signal path 110 to MIMICE 32 thence to pad 112. Output signal path 110 comprises an application specific circuit 16 for transmission of output signal 14 and signal converter 50 (preferentially an ultra wide band pulse generator, or alternatively, a continuous carrier RF modulator). Output signal 14 originates from first circuit 16 and transformed by signal converter 50. The output of the signal converter 50 is electrically coupled to first half-cell 32*a* of MIMICE 32 and thus coupled electromagnetically to the juxtaposed second half-cell 32*b* of MIMICE 32. Second half-cell 32*b* of MIMICE 32 is electrically coupled to pad 112 as in FIG. 7*e* or to pads 112*a* and 112*b*. A signal incoming at pad 112 is transmitted via MIMICE 32 and input signal path 114 to application specific circuit 24. Pad 112 is electrically coupled to second half cell 32*b* of MIMICE 32 and thus a signal present at pad 112 is preferentially coupled electromagnetically to the juxtaposed first half-cell 32*a* of MIMICE 32. First half-cell 32*a* of MIMICE 32 is electrically coupled to input signal path 114. Referring to FIGS. 7*d* and 7*f*, the input signal path has a signal converter 52 (preferentially an ultra wide band pulse receiver, or alternatively, a continuous carrier RF demodulator), a signal processing element 28*a* and application specific circuit 24. An image 14*a* of signal 14 is electrically coupled to signal processing element 28*a*. Signal processing element 28*a* applies a transform to the input signal path. Signal processing element 28*a* preferentially performs a subtract function but could perform other mathematical or signal processing functions. In the preferred embodiment, signal processing element 28*a* subtracts image 14*a* from receive signal 14*b* thus enabling application specific circuit 24 to receive only incoming signals to pad 112 and to ignore the near end transmitted signals 14. The output of signal processing element 28*a* is electrically coupled to application specific circuit 24. When one pad 112 is electrically connected to second half cell 32*b* of MIMICE 32, input apparatus 230 is non-differential as illustrated in FIG. 7*d*. When two pads 112*a*, 112*b* are electrically connected to second half cell 32*b* of MIMICE 32, apparatus 230 is differential as illustrated in FIG. 7*f*. In this manner, a full duplex communication can be carried out simultaneously in both directions over MIMICE 32. This enables simultaneous bi-directional communications over a single wire or a pair of wires while maintaining the other advantages of the MIMICE 32 that is protection, high speed, and small size and reduced power consumption. Apparatus illustrated in other FIGS. 7a-c, 7e, 7g can be used in a manner which is input or output or time switched between each side.

Referring to FIGS. 7c and 7e, apparatus 230 has two pads 112a, 112b and so is a differential I/O cell, whereas apparatus 230 as illustrated in FIGS. 7a, 7b and 7d is a non-differential I/O cell. These figures show different implementations of single ended double ended, differential, non-differential, and bi-directional methods of instantiating MIMICE 32. Each may have an advantage that is one or more of size or speed or applicability to the specific application. For example, some technologies are easier to implement in single ended architectures than others, differential systems are capable higher speed but use two wires for each signal, etc. These examples show the flexibility of MIMICE 32 in different apparatus and applications.

Referring to FIG. 8a, a device 120 may be in communication with a plurality of other devices 120(x), where x is a number from 1 to n, via wire links 54. Device 120 has a transmission circuit 56 and a receiving circuit 58. Transmitting circuit 56 is wired via one branched link 54 to receiving circuits 58 at each of other devices 120(x). Similarly, receiving circuit 56 at device 120 receives signals transmitted from transmitting circuits 56 at each of other devices 120(x). Transmission circuits 56 and receiving circuits 58 may be integrated into device 120 or may be separate chips. It will be understood that teachings herein can be applied to a variety of packages and devices not limited to a single a package or package type. For example, device 120 and device 120(x) may be, without limitation, a monolithic integrated circuit, a multi-chip module, or system in package component, a printed circuit card, chip, substrate, PCB, MEMS device, etc., or a combination of these. Transmission circuits 56 and receiving circuits 58 can be unidirectional or bi-directional, one of differential or single ended pad signalling. Circuits 56 and 58 incorporate the full cells or half-cells that make up MIMICE 32 in accordance with the teachings contained herein.

Referring to FIG. 8b, when each of a set of devices 120 has bi-directional communication capability provided by apparatus 230 installed at elements 56, 58, communication between a plurality of said devices 120 can be in bi-directional and full duplex mode via wire links 54. In FIG. 8b element 120 can be any of a chip, substrate, PCB, MEMS device, etc. and element 61 can be any of unidirectional or bi-directional differential cells as discussed previously. Chips 56 and 58 are both included in each element 61 in accordance with the teachings contained herein, such that each element 61 also includes MIMICE 32.

Referring to FIG. 8c shows how a device comprising several MIMICE 32, included in element 61 as described above, can enable devices to communicate along a single differential pair. This allows extended application including use over extended distances and at different nodes. This may be a distributed or so-called bus form of communication between, for example, processing units or one of many applications for such a device. The loop connection topology shown allows more than one apparatus to communicate via interconnection and use a variety of known techniques for signal stabilization and timing. Each device can be centrally or individually timed and several techniques in that art can be used to compensate for greater or lesser distances and signal states. MIMICE 32 in this case allows a distributed high speed system to be created without the burden of needing ESD protection at each node. Other techniques would require extensive ESD and buffering which would have to be additionally compensated for. Such compensation requires greater power and introduces impairments which must be further compensated, thus the MIMICE 32 doubly benefits applications and implementations.

FIGS. 9a and 10 illustrate construction side views of MIMICE 32 that may be incorporated into apparatus 30, apparatus 130 and apparatus 230, examples of which will now be described. FIG. 10 also shows a stacked double insulated MIMICE 32. The ground connection may be grounded, floating, or tied to ESD protection to maximize speed protection or other parameter. FIG. 10 also shows the monolithic nature of the MIMICE 32 construction into a monolithic body 400. It will be understood from FIG. 10 that one or more of the half cells 32a and 32b may be recessed from the face of the electronic device it is associated with that is adjacent the other electronic device and that it is in communication with. The term "recessed" is used to describe the half-cell being embedded in the electronic device, or positioned within a cavity, such as if the half cell were monolithically formed. While the half-cell is recessed, the outer surface may still be flush with the face of the electronic device due to the height of the half-cell. The half-cell may also be embedded by placing a layer of solid dielectric material over the half-cell.

One should note the preferred embodiment of MIMICE 32 has planar, quasi two dimensional structures which are compatible with IC fabrication and not separate and disparate component construction of coils, capacitors, windings, cores, interconnects of prior art communications interconnection techniques.

Illustrations of the layered architecture on chip 12 having one or more of I/O apparatus 30, 130, 230 are shown in FIG. 9a. Referring to FIG. 9a, chip 12 comprises a base 72 onto which are bonded a plurality of layers 74. Active electrical components and electrical insulators situated in layers 74 are the working components of chip 12. Chip 12 is supported on a substrate 82. In this illustration, a first half-cell 76 and a second half-cell 78a are shown. It can be seen from this illustration that it is possible to position elements of the integrated circuit below the half-cells 76 and 78a as shown. This may be advantageous, for example, when the half-cells 76 and 78a are inductors, which may take up a relatively large amount of area on the chip 12.

FIG. 9a also illustrates that the active circuits 74a can be placed under the MIMICE and connection elements 76, 78a, 78b, 112. This is a key feature in that the structures can be thus made very small completely under the MIMICE structure. In this illustration, elements, such as pad 112, can be recessed into a non-interfering manner protecting against electrical contact with elements 76 and 78a, and embedded within the structure 12. This provides galvanic isolation to external elements and structures or subsequent MIMICE additional structures, such as element 78b.

As first half-cell 76 and second half-cell 78a are parallel to and closely adjacent or juxtaposed to each other, there are strong communications between them. When electrical components are in stacked layers 74 of chip 12, the demand for surface area is reduced to devices where all components are in one or more layers. Among the other components is a conductive pad 112, usually metal. In the present application, metal pad 112 and first half-cell 76 are in electrical communication when they both are components of an input apparatus, output apparatus, or input/output apparatus, as illustrated in FIGS. 2a through 7g. Alternatively, metal pad 112 may serve for attachment of hardwired connections to other chips or electrical components that are mounted on the same substrate 82 as chip 12.

Referring to FIG. 9b, because of the small size and low power of the illustrated design, multiple MIMICE 32 cells can be placed on a single monolithic IC without the higher heat generation and power supply limitations that inhibit applications of prior art technologies and techniques. The principles discussed herein enable massively parallel operation without wasting energy on driving protection capacitance or other circuits. The principles enable preferential impedance matching, which also adds to the energy efficiency compared to of that of the prior art.

Referring to FIG. 10, in one example an input structure and an output structure of one of output apparatus 30, input apparatus 130 or input/output apparatus 230 are separated by a dielectric layer or layers 32z. In a second example, two extra layers are interposed between the input layer and the output: a shield structure 36 and an additional layer of dielectric 32z to ensure that the respective components of the circuitry and shield 36 are electrically insulated from one another. While in this illustrative example the shield is grounded, it could be connected to other structures as required. The MIMICE 32 structure shown as "coupled inductors" is comprised of two half-cell elements 32a, 32b containing inductive, capacitive and conductive elements monolithically built into the IC body 400. One of the half-cells connects to the internal chip circuitry and the other half-cell connects to pads external to the IC body 400. Thus, internal active electronics in either package associated with the half-cells are not directly exposed to external I/O signals or stresses. As will be discussed below, this design enables two packages to be separated by distances 32d while still communicating in a protected, high speed and efficient manner. The dielectric isolation 32z supports isolation and protection while the coupling of the two half-cells 32a, 32b is designed to be preferential for high speed signalling purposes. In addition, the dielectric isolation of separation distance 32d also increases isolation and protection. The MIMICE 32 could be built in a non-monolithic manner should the application warrant it. The discussion with respect to the device being monolithic is a preferred embodiment, but other designs will also be apparent to those skilled in the art and based on the discussion herein. Applications where the two half cells are separated for testing is one such additional application.

Referring to FIGS. 11a through 11g, pad 112 may be in electrical communication with other electronic components via connections 84, with connections 84 selected from among hardwire connections and communication links via a MIMICE or half-cell (not illustrated) at pad 112. For example, when pad 112 on chip 12 is attached to a substrate 82 such as a laminate printed circuit board, it is in communication with other chips on that same substrate. Substrate 82 may be one of a mono or multilayer laminate material, silicon material, ceramic material, polyamid material, or other rigid or flexible material that is used to support and interconnect electronic circuits. The figures illustrate non limiting examples of microelectronic packages such as chip-on-board, chip-on-package, package-on-package, package-on-board, system-in-package and integrated passive device.

Similar or different embodiments of apparatus 30, 130 or 230 may be mounted on separate chips 12 that are in communication. For example, a first chip 56 and a second chip 58 can be mounted on the same substrate as illustrated in FIGS. 11a and 11b. Alternatively, the architecture may be flip chip or chip-on-chip (FIG. 11c).

Referring to FIG. 11a, each of first chip 56 and second chip 58 has at least one pad 112. Substrate 82 has at least two pads 112 interconnected by wired connection 84 for transmission of electrical signals. Each pad 112 on one of chips 56, 58 is wire bonded 86 to one of pads 112 on substrate 82, thereby interconnecting first chip 56 and second chip 58. Alternatively, wirebond 86 may be connected directly from pad 112 on chip 56 to pad 112 on chip 58 thereby bypassing wired connection 84 on substrate 82.

Referring to FIG. 11b, pads 112 of the chip-on-chip combination are similarly in communication via wire bonds 86. In this illustrative example, first chip 56 and second chip 58 are electrically connected to connections 92 embedded in substrate 82 that are themselves electrically connected to wired connection 84.

Figure 11C:
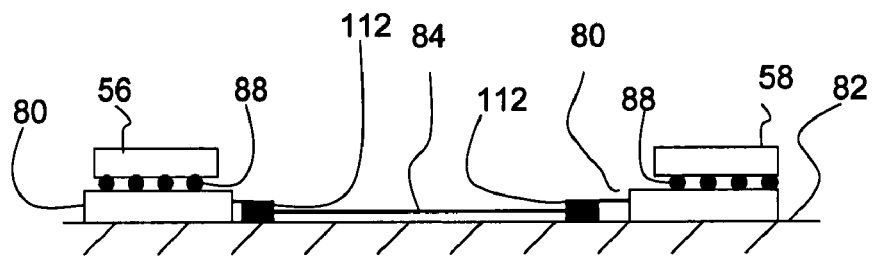
FIG. 11c is a diagram illustrating flip chip interconnect within a package and interconnection on a substrate.
Figure 11D:
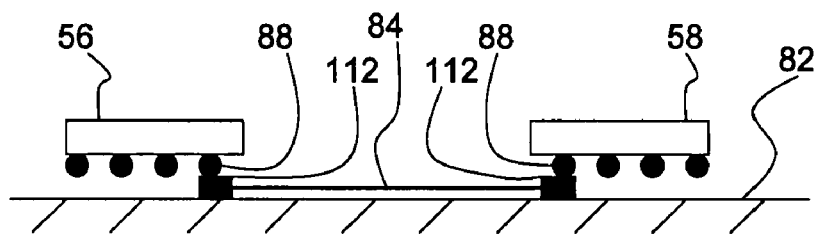
FIG. 11d is a diagram illustrating flip chip design having the chips in direct electrical connection with pads on the substrate.

Referring to FIGS. 11c and 11d, when one or both of first chip 56 and second chip 58 are in "flip chip" orientation relative to substrate 82, each flip chip 56, 58 has at least one solder ball or post 88. FIG. 11c illustrates chips 56, 58 in communication with electrical connectors 80 mounted on substrate 82. Alternatively, electrical connector 80 may be a package, socket, interposer or other space transformer. FIG. 11d shows chips 56, 58 in direct communication by way of pads 112 mounted on substrate 82 interconnected by wired connection 84. Electrical connection to pad 112 on substrate 82 is achieved by conductive contact between pad 112 and solder ball or post 88. Note additional contacts between substrate 82 and chips 56 and 58 have been intentionally omitted from FIG. 11d for clarity.

Figure 11E:
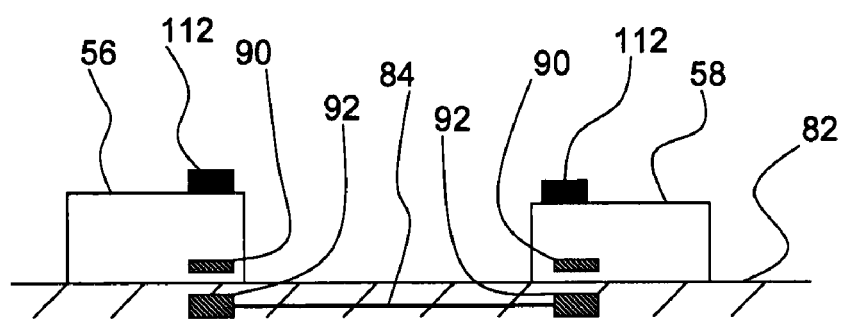
FIG. 11e is a diagram of chips interconnected on a substrate using half-cell on monolith and half-cell on substrate and connected via a transmission line.

Referring to FIG. 11e, either or both of first chip 56 and second chip 58 may have a first half-cell 90 for transmission/reception of signals. Substrate 82 has a matching second half-cell 92 interconnected by wired connection 84. A signal transmitted from first chip 56 via first half cell 90 adjacent said first chip 56, is coupled to the corresponding second half cell 92, transmitted along wired interconnection 84 to second half cell 92 adjacent second chip 56, from which it is coupled to first half cell 90 on second chip or device 58. As illustrated in FIG. 12a, it is preferred that second half cell 92 and wired interconnection 84 are embedded in substrate 82, however interconnection 84 may be formed on or mounted to the surface of substrate 82. Alternatively, first chip 56 or second chip 58 or both in combination may be flip chip mounted using solder balls. Such technique would introduce a separation between the chips 56 and 58 and the substrate 82 thereby introducing another dielectric barrier (preferably air but could be another gas or solid or evacuated and sealed in a vacuum) between first half cell 90 and second half cell 92.

Figure 11F:
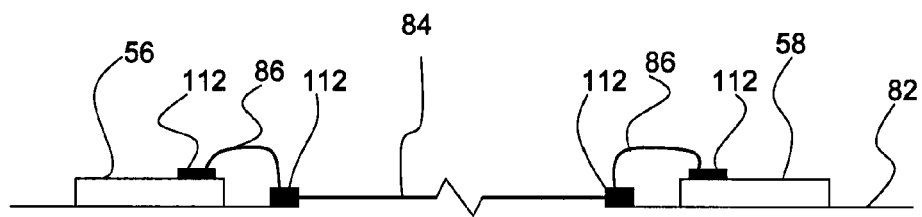
FIG. 11f is a diagram of chips interconnected using wired interconnect.
Figure 11G:
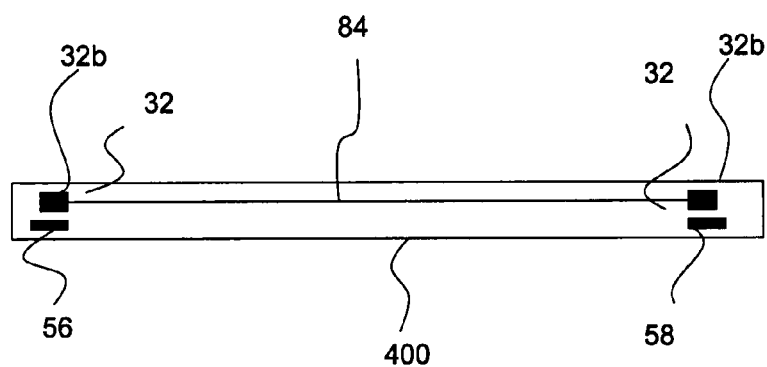
FIG. 11g is a diagram of MIMICE interconnected using wired interconnect on a single integrated circuit.

Referring to FIG. 11f, pad 112 is in electrical communication with other electronic components via wired connections such that chips 56 and 58 can be at large distance from each other such as packaged chips on a printed circuit board or packaged chips on separate printed circuit boards. Herein the MIMICE 32 devices allow isolation between chips and enhanced communications. In this case, with a MIMICE 32 at each end of the wired communications link, there are two isolation protection barriers between the chips. This allows each end to float at a different potential with respect to the other and further allowing each chip to be operated at different power supply voltage levels. This can be done over long distances such as wired or coaxial or transmission line connections. This double isolation provides protection from contention which would normally inhibit or limit communications in other systems. In this example the two chips could be on different cards and communicating over a conductive backplane or ribbon cable.

Referring to FIG. 11g, electrical communication with other electronic components via internal connections in this illustration such that internals transmitter and receiver functions 56 and 58 can be at large distances or separate functions within a single IC body 400. Herein the MIMICE 32, and half cells 32a, devices allow isolation between chips and enhanced communications. In this case, with a MIMICE 32 at each end of the internally wired communications link 84, there are isolation protection barriers between the functions within the one IC. This allows each end and the middle communications wires each to be operated at different voltages and thus be immune to interference from each to each other.

FIG. 12a is an illustrative example of using interstitial element 320, in place of element 32 in other figures, for enhanced coupling and/or extended protection. FIG. 12a shows a method of creating multi-layer separation between the input and the output for extended ESD protection using interstitial element comprising two half cells 320a 320b between primary and secondary elements 32a and 32b of the MIMICE 32 structure. Half cells 320a and 320b may be on a separate chip or substrate than half cells 32a and 32b. Alternatively, half cells 320a and 320b may be located on the same chip body as half cells 32a and 32b.

The advantage of this architecture is that it provides enhanced protection by 100% over that of a single element (comprising two half cells 32a 32b) by using two dielectric interfaces 32z instead of only one illustrated in FIG. 2a. The extra interstitial elements 320a, 320b in between can be designed as needed to isolate the input and output signals. Optionally interstitial cells or half-cells can be used on multiple mask layers for extended isolation. Multiple MIMICE can be connected in series to increase the dielectric isolation and ESD protection level, without the need for active ESD structures. Further, MIMICE can be stacked vertically or placed laterally or a combination of stacking and lateral placement.

The interstitial cell also allows for further impedance matching to optimally match internal signals to external signals. For example if an output buffer has a 5-ohm impedance and the external link requires 100 ohms for perfect impedance matching, a 5:100 or 1:20 transformation is needed. It is advantageous to use this form of MIMICE 32 to allow two impedance transformations, one between half cells 32a and 320a and a second between half cells 320b and 32b. An example would be 1:4 and 1:5 coupling ratios giving a total impedance transformation of 1:(4×5) or 1:20, providing ideal impedance matching. Optionally the center couple half cells 320a and 320b can be connected to ground or other protection surge protection circuit to provide additional protection of IC internal circuitry.

For example, in FIG. 11e, which is an example implementation of FIG. 12a, it is preferred that a signal transmitted via first half-cell 90 and second half-cell 92 is a signal which uses a small amount of energy. A micro-pulse signal is an illustrative one which can be used with a MIMICE 32 device. A greater amount of energy is used when a broader signal is transmitted, and so there is a greater amount of heat generated in first application specific circuit 16 and pad 112, and all electrical interconnections between them. When signal 14 (in FIGS. 7a to 7f) is a micro-pulse signal, there is considerably less energy consumed and less heat generated. It will be recognized that different micro-pulse signals 14 can travel in opposite directions along all lines of communication, allowing full duplexing.

Figure 12B:
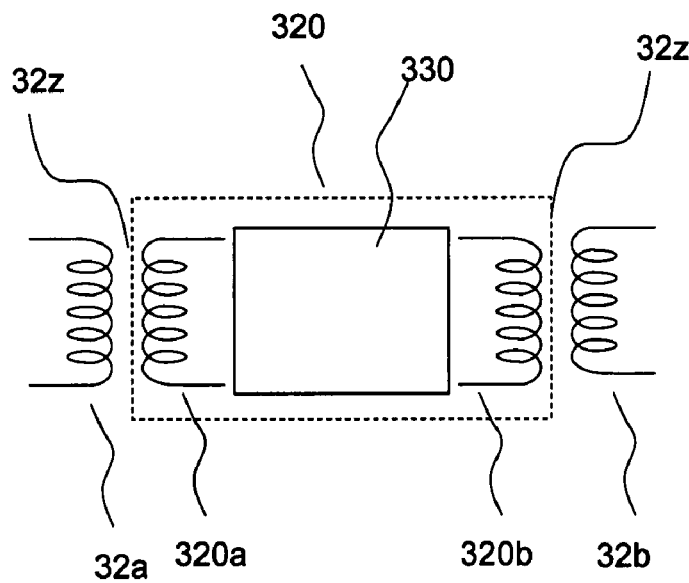
FIG. 12b is an example of using an interstitial MIMICE device with passive and or active internal elements to provide signalling enhancement and or extended isolation/protection.

FIG. 12b shows how the half cells can be enhanced by the use of an interstitial device to enhance signal quality or provide further protection. In this figure, element 330 may consist of active or passive elements which can further enhance signals. One example would be to have element 330 as a repeater of signals entering the edge elements 32a. An example of passive elements would be monolithic inductive and capacitive elements to perform filtering to enhance desired signals and reduce unwanted ones. Those skilled in the art would find this aspect of great utility for many of the conditions found in real world applications. Element 330 can be used for improved extended isolation/protection using passive or semi-active devices such as semi-conductor clamps which have low impact on the desired signals.

Because of the enhanced communication possible with a MIMICE 32 device it is possible to envision applications in several areas. One example it to use a MIMICE 32 interface for the production and testing of ICs where the MIMICE 32 devices are used further after testing for interconnect of high speed signals. In this way the MIMICE 32 devices can be used for intentional access and later communications without the need for separate communications channels. This is illustrated in FIG. 13a where the half cell of a MIMICE 32 is used for on-chip or on-wafer testing and later for chip-to-chip communications by the addition of different half cells which terminate for different purposes.

Figure 13A:
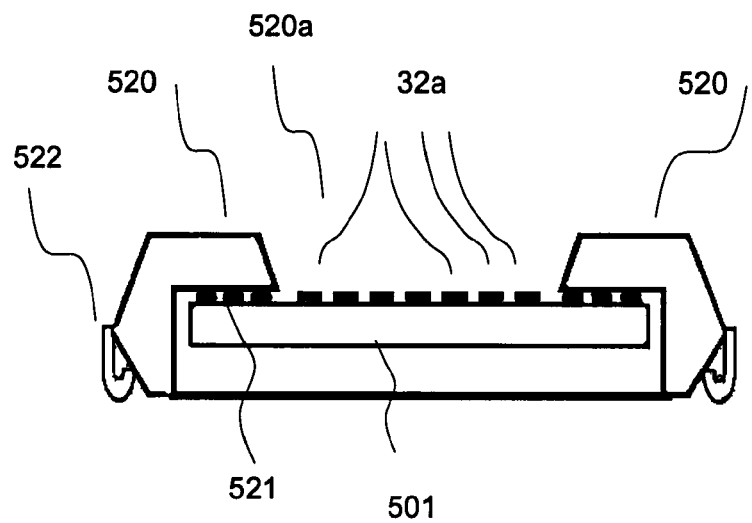
FIG. 13a is an illustration showing how a half cell of a MIMICE device may be created with a packaged IC.

FIG. 13a shows a package 520 for an IC 501 with external connections 522 and internal package connections 521. Also shown is open cavity 520a in the package 520 which is a standard technique often used to enable internal connections such as wirebonding to be placed between the IC and its external connections. In this illustration wirebonding is not shown as it is a well known technique. What is shown is that the MIMICE 32 technique can be used with other packaging techniques, for example, a lead frame or ceramic carrier. In this case the internal connections are shown as flip chip solder balls or thermo-compression interconnects 521. In this illustration the half cells 32a of the MIMICE 32 device are exposed. In this case they are available for access and communications for testing of the packaged device before encapsulation, final lidding or glob top. Providing access to a packaged device for testing and communications is a benefit to the MIMICE 32 technique. The full cell can be completed temporarily for testing or permanently for communications to other devices.

Figure 13B:
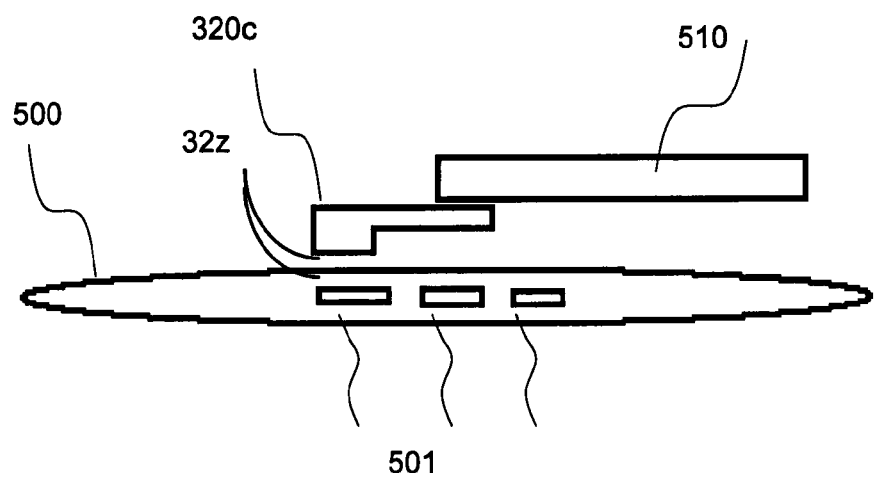
FIG. 13b is an illustration showing how a MIMICE device can be used for testing devices for example on a silicon wafer.

FIG. 13b shows how the separable half cell MIMICE can be used for testing and communicating to devices 501 in wafer form 500. Device 501 is an individual IC location on a wafer 500 while the half cell air gap is 32z is shown between the 320c half cell which is connected to communications or test equipment 510. In this application of MIMICE 32 devices they are used in the earliest stages of fabrication testing and assembly for partially or fully fabricated wafers and devices. One should note that there are several techniques known in the art to allow the separation of 32z to be made arbitrarily small such that the performance can be virtually the same as that of a monolithic device including temporary dielectrics applied only for period of testing. One should note that silicon wafer is an example for illustrative purposes, and that other devices such as assemblies or panels of devices can be used in a similar manner. Panels of ICs on laminates or frames are an example that can utilize the MIMICE 32 concept. Also while FIG. 13b shows a single headed device it will be recognized that the same application can be performed in a parallel or multiplex manner, thereby enabling parallel communications or testing to be performed.

Figure 13C:
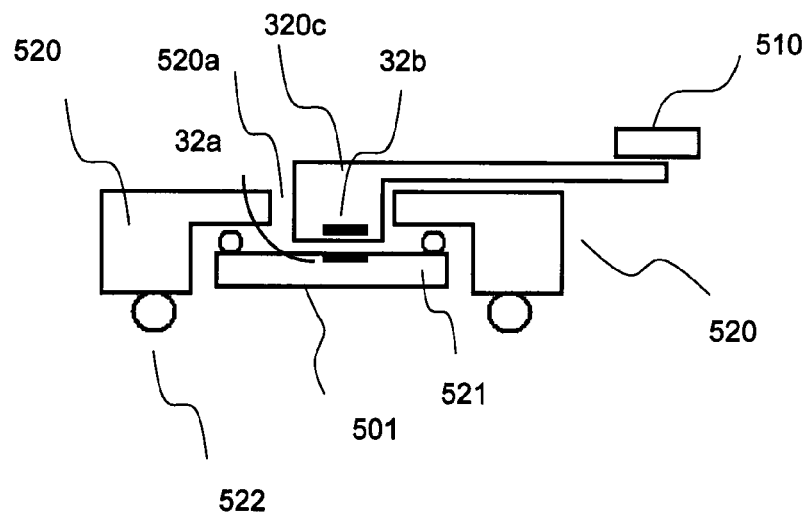
FIG. 13c is an illustration showing how a MIMICE device can be used for testing devices mounted in packaged ICs

FIG. 13c shows a packaged 520 IC 501 with no lid installed and into which a half cell MIMICE 32 device 320c is inserted for testing. This is an illustration showing how a MIMICE 32 device can be used for testing devices mounted in packaged ICs. The test equipment or testers 510 are interfaced thru a half cell 32b to the IC 501 half cell 32a. Also shown are internal and external electrical package connections 521 522 shown as solder balls in this illustration. The benefits of isolation combined with high speed communications are useful in this illustrated application of the MIMICE 32 concept.

Figure 13D:
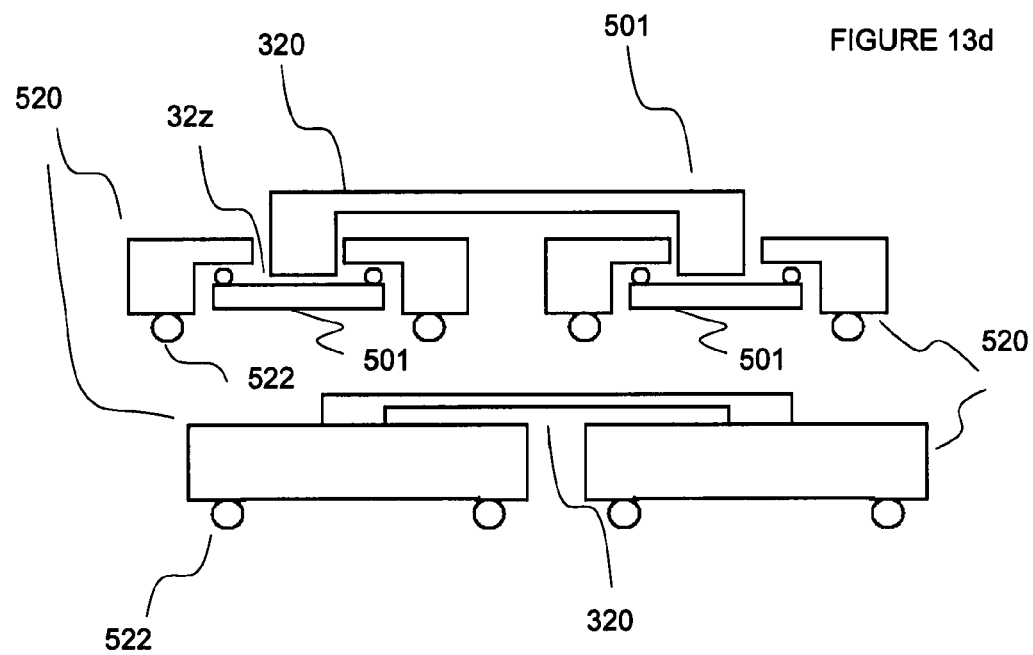
FIG. 13d is an illustration showing how MIMICE devices can be constructed for use to enable communications between two packaged devices.

FIG. 13d shows two ICs interconnected with a MIMICE 32 interface 320 enabling chip to chip communications. In this case after testing it is possible to use the same interface which was used for testing for chip to chip communications. The top illustration shows a cross section of the packaged ICs 520 and their internal ICs 501 and the isolation/dielectric gap or barrier 32z forming MIMICE 32 interconnect 320 between the two ICs. The lower illustration shows a finished packaged two chip system. One of several well known fabrication techniques can be used to seal the system as required by the application. Glob top or vacuum backfill are two techniques known in the industry. In this way a multiple internal chip solution can be aggregated together using MIMICE 32 methods to create greater performance and utility. One example would be to have a microprocessor chip connected with MIMICE 32 apparatus to a memory chip. The high speed and low power of the MIMICE 32 technology would enable multiple advantages to such products and systems.

Figure 13E:
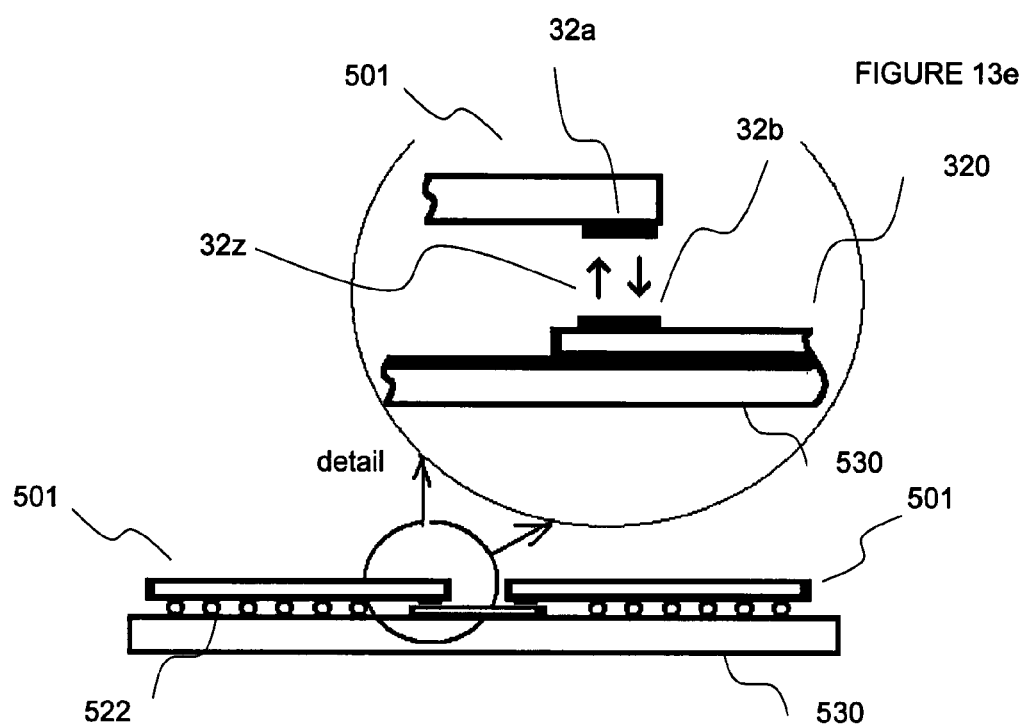
FIG. 13e is an illustration showing how MIMICE devices can be configured to enable communications for an assembly of ICs.

FIG. 13e is an illustration showing how two devices 501 of a different packaging technique can be connected with MIMICE 32 devices. In this application of MIMICE 32 technology the devices 501 are bare dies which are flip chip bonded to a carrier or substrate 530. In this case the MIMICE 32 half cells 32a are fabricated on the bare IC 501 and flipped and bonded to a substrate by in the illustrative example micro solder balls or posts 521. Very high density packaging can be obtained in this way and the MIMICE 32 can be used for chip to chip communications as illustrated in this FIG. 13e. In this case the MIMICE 32 interconnect 32b is shown as part of or constructed on the substrate 530. The half cells 32a 32b and dielectric gap 32z are shown in the illustration detail, which is not to scale. The dielectric gap as discussed above can be constructed out of various dielectric materials and controlled with micro-fabrication techniques. Multiple dies can be placed with high density using this technique and MIMICE 32 technology enables close communications between devices which would be otherwise restricted by space, speed and power consumption considerations.

Figure 13F:
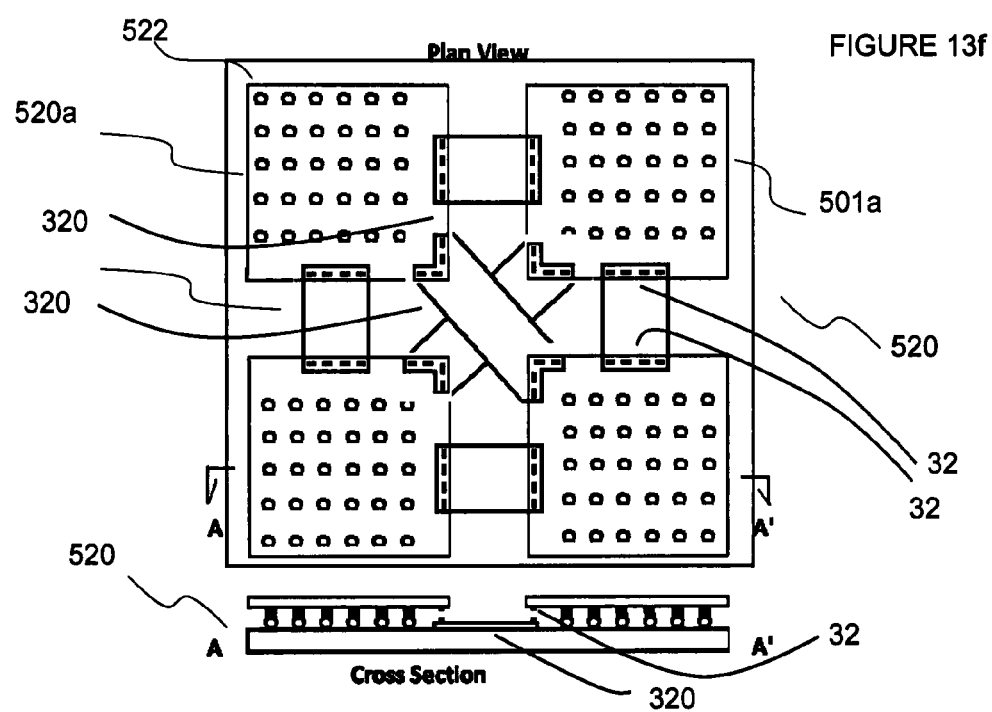
FIG. 13f is an illustration showing how MIMICE devices can be configured to enable multiple device or IC communications.

FIG. 13f shows multiple ICs 501s interconnected with multiple MIMICE 320 and 32. This illustration shows a plan view of four chips or ICs in a full interconnected topology for applications such as a System In Package (SIP) or a multi-processor system. Also shown is package outline 501a showing the potential of this technique to create systems in a package. Not shown are either external signal connections or final package fill for which there are well known techniques and solutions.

In this illustration each IC 501 can communicate with each other IC via a direct MIMICE 32 enabled communications path. The benefits of low power and high speed manifest themselves in multiple ways for multichip systems, not the least of which is power requirements which would otherwise limit multiple chip designs. The power savings described earlier by not having to support ESD structures etc. allow a system like that illustrated to grow beyond the previous limits. With these teachings, one skilled in the art will envision other applications including multiple systems designs with high speed microprocessors memory etc. combined into one system.

Figure 13G:
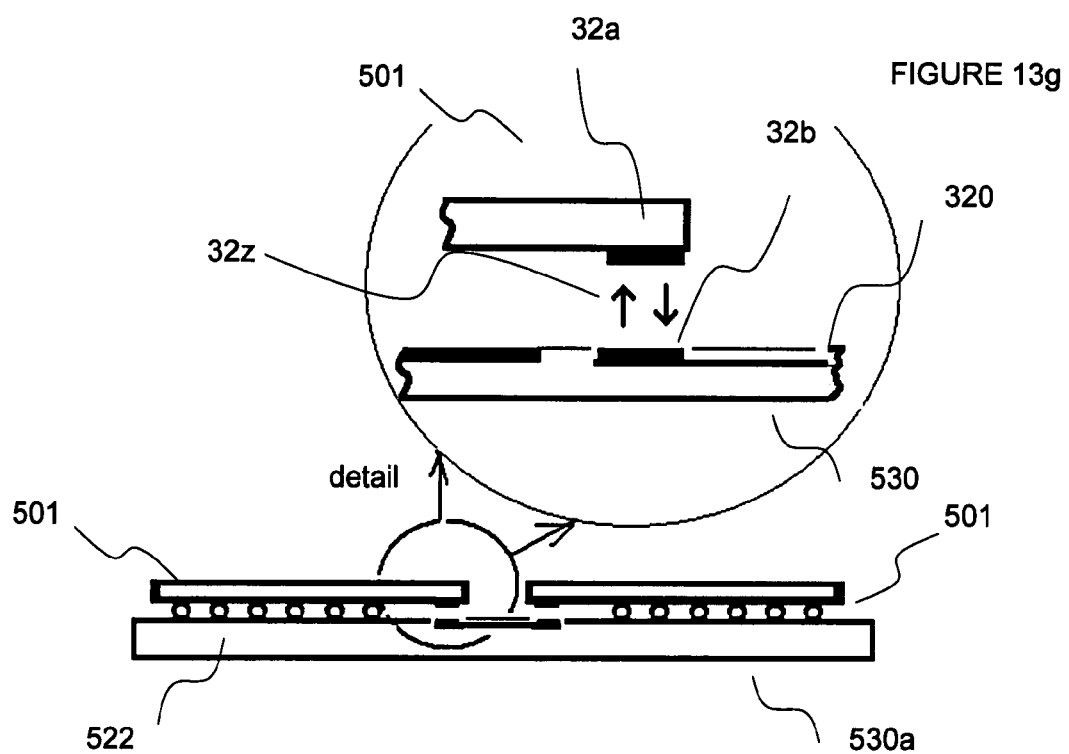
FIG. 13g is an illustration showing how MIMICE devices can be configured to be embedded into a substrate to enable communications between an assemblies of ICs.

FIG. 13g shows how MIMICE 32 structures can be embedded into substrates to facilitate communications between two or more integrated circuits. In this case is an illustration showing how MIMICE 32 devices can be configured to be embedded into a substrate to enable communications between assemblies of ICs. Several known substrate techniques can accommodate MIMICE 32 and enhancements as outlined in FIG. 12b element 330. Substrate techniques such as Printed Circuit Boards (PCB), Multichip Modules (MCM), ceramic substrates, Passive Integrated Circuit Substrates (PICS), Redistribution Chip/Circuit Packaging (RCP) etc. are techniques and applications of the MIMICE 32 technique and apparatus. In FIG. 13g, elements of FIG. 13e (32b, 320, 530) are integrated into the substrate 530a which can be done using several well known techniques.

Several advantages accrue from each embodiment of the MIMICE 32 apparatus as shown in the above by way of example apparatus 30, apparatus 130, and apparatus 230 when compared with the standard approaches exemplified by apparatus 10.

Prior art and standard practice apparatus 10:
has a high capacitance,
requires high power to amplify and transmit signal 14,
has low speed of transmission of signal 14,
causes delay in transmission of signal 14, and
the sum of the components of apparatus 10 requires a large area.

In contrast, because each embodiment of apparatus 30, apparatus 130 and apparatus 230 has no electrostatic discharge diodes, and because signal converter 50 has low capacitance, each of apparatus 30, apparatus 130 and apparatus 230:
has a much lower overall capacitance than that of prior art apparatus 10,
has much higher speed than prior art apparatus 10,
allows very high rates of data transfer to/from pad 112,
has a higher coupling coefficient,
requires far less power to transmit signal 14 to/from pad 112, and so
produces far less heat than prior art apparatus 10,
has a low requirement for area,
enables transmission/reception of signals having a wide range of frequencies, and in particular has better capability to transmit/receive high frequency signals when compared to prior art apparatus 10,
galvanic isolation between circuits
ability to power chips with different power supplies or different voltages or different ground potentials or a combination of these; and
improved signal integrity.

Another advantage is that, in contrast to some prior art which requires particular data transmission techniques, the devices described above can be used with well known standard methods such as clock and data encoding, phase locked loops or even simple received data thresholding to achieve very high data rates and speeds.

The signal coupling in the embodiments described above is shown to be enhanced qualitatively and quantitatively beyond the loose electromagnetic coupling described in the prior art to the point of enabling sufficient signals for robust data transfer. Furthermore, coupling is achieved by close proximity and in fact, is monolithic in one illustrated embodiment or near monolithic construction in another embodiment rather than depending on several disparate components and structures to achieve loose, or weak, electromagnetic coupling.

In one embodiment, the teachings purposely couple and create strong signals and strong coupling to enhance signalling capability and provide high speed preferenced communications for signal transfer, data transfer and any number of other specific applications.

Thus the above teachings can be used advantageously for more rapid communications between integrated circuits and related circuits than can be attained using prior art systems. Applications include communications for serial and parallel needs and standards such as Ethernet controllers and microprocessors, and between any of combinations of field programmable gate arrays (FPGA), microprocessors, memory devices, digital signal processors, DRAM, etc.

The device described above is not limited in its various applications to the details of construction and the arrangement of components set forth in the previous and following description or as illustrated in the drawings. It is capable of other embodiments and of being practiced or of being carried out in various ways. Also, the language and terminology used here is for the purpose of description and should not be regarded as limiting. The use of "including," "comprising," or "having," "containing", "involving", and variations thereof herein, is meant to encompass the items listed before and after and equivalents thereof as well as additional items. A reference to an element by the indefinite article "a" does not exclude the possibility that more than one of the element is present, unless the context clearly requires that there be one and only one of the elements.

The following claims are understood to include what is specifically illustrated and described above, what is conceptually equivalent, and what can be obviously substituted. Those skilled in the art will appreciate that various adaptations and modifications of the described embodiments can be configured without departing from the scope of the claims. The illustrated embodiments have been set forth only as examples and should not be taken as limiting the invention. It is to be understood that, within the scope of the following claims, the invention may be practiced other than as specifically illustrated and described.

We claim:

1. An interconnect for transmitting an electric signal between electronic devices, comprising:
    a first inductive coil inductively coupled to, and immediately juxtaposed to, a second inductive coil;
    the first inductive coil being mounted on and electrically connected within a layer of a first integrated circuit in a first electronic device, and the second inductive coil being mounted on and electrically connected within a layer of a second integrated circuit in a second electronic device, each of the first electronic device and the second electronic device having a first face and a second face parallel to the layers of the first and second integrated circuits, the first face of the first electronic device being immediately adjacent to the first face of the second electronic device;
    the first inductive coil and the second inductive coil being separated by a dielectric barrier;
    at least one signal converter connected to at least one of the first inductive coil and the second inductive coil, the signal converter comprising one of a RF carrier wave modulator, a RF carrier wave demodulator, an ultra-wide band pulse to digital modulator and an ultra-wide band pulse to digital demodulator.

2. The interconnect of claim 1, wherein the dielectric barrier comprises at least one of a solid dielectric material and air.

3. The interconnect of claim 1, wherein the dielectric barrier comprises a shield component for shielding against external signals.

4. The interconnect of claim 1, wherein the first inductive coil is embedded in the corresponding electronic device.

5. The interconnect of claim 1, wherein the second inductive coil is recessed from the first face of the second electronic device.

6. The interconnect of claim 1, wherein at least one of the first inductive coil and the second inductive coil is monolithically formed in the corresponding electronic device.

7. The interconnect of claim 6, wherein the RF carrier is a continuous wave.

8. The interconnect of claim 1, wherein at least one of the first inductive coil and the second inductive coil are connected to a differential input or a differential output in the corresponding integrated circuit.

9. The interconnect of claim 1, further comprising a third inductive coil electromagnetically coupled to, and immediately juxtaposed to, a fourth inductive coil, the third inductive coil being electrically connected to the second inductive coil, such that the second and third inductive coils are interstitial elements.

10. The interconnect of claim 1, wherein the first inductive coil and the second inductive coil are connected to components in the corresponding integrated circuit that permit bi-directional communication.

11. The interconnect of claim 1, wherein the first inductive coil and the second inductive coil are connected by a resistance of more than 100,000 ohms to provide DC restoration.

12. The interconnect of claim 1, wherein the integrated circuit of at least one of the electronic devices is positioned at least partially between the second face and the corresponding inductive coil.

13. The interconnect of claim 1, wherein the first electronic device and the second electronic device are mounted to a common substrate.

14. The interconnect of claim 1, wherein at least one of the first electronic device and the second electronic device are mounted to a movable substrate.

* * * * *